(12) United States Patent
Chang

(10) Patent No.: US 12,463,178 B2
(45) Date of Patent: Nov. 4, 2025

(54) SEMICONDUCTOR DIE ASSEMBLY HAVING A POLYGONAL LINKING DIE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 578 days.

(21) Appl. No.: 17/810,606

(22) Filed: Jul. 3, 2022

(65) Prior Publication Data
US 2024/0006374 A1   Jan. 4, 2024

(51) Int. Cl.
| H01L 25/065 | (2023.01) |
| H01L 23/00 | (2006.01) |
| H01L 23/538 | (2006.01) |
| H01L 25/00 | (2006.01) |

(52) U.S. Cl.
CPC ...... *H01L 25/0652* (2013.01); *H01L 23/5381* (2013.01); *H01L 23/5386* (2013.01); *H01L 24/08* (2013.01); *H01L 24/16* (2013.01); *H01L 24/80* (2013.01); *H01L 25/50* (2013.01); *H01L 2224/08145* (2013.01); *H01L 2224/16145* (2013.01); *H01L 2224/16225* (2013.01); *H01L 2224/80895* (2013.01); *H01L 2224/80896* (2013.01); *H01L 2924/10156* (2013.01); *H01L 2924/15331* (2013.01)

(58) Field of Classification Search
CPC . H01L 25/0652; H01L 25/50; H01L 23/5381; H01L 23/5386; H01L 24/08; H01L 24/16; H01L 24/80
See application file for complete search history.

(56) References Cited

U.S. PATENT DOCUMENTS

| 7,671,449 | B2* | 3/2010 | Zingher | H01L 25/0655 257/E23.079 |
| 7,969,009 | B2* | 6/2011 | Chandrasekaran | H01L 25/0652 257/774 |
| 9,368,450 | B1* | 6/2016 | Gu | H01L 23/5385 |
| 9,443,824 | B1* | 9/2016 | We | H01L 23/3114 |
| 9,548,264 | B2* | 1/2017 | Roy | H01L 23/49866 |
| 10,784,202 | B2* | 9/2020 | Arguin | H01L 23/49827 |
| 10,804,188 | B2* | 10/2020 | Deng | H01L 23/49822 |

(Continued)

OTHER PUBLICATIONS

Notice of Allowance received in the counterpart Taiwan application 112119334, mailed on Apr. 16, 2024.

*Primary Examiner* — Nathan W Ha
(74) *Attorney, Agent, or Firm* — KILPATRICK TOWNSEND & STOCKTON LLP

(57) ABSTRACT

A semiconductor die assembly is provided. The semiconductor die assembly includes: a first bottom die and a second bottom die disposed at a bottom vertical level; a first top die disposed at a top vertical level above the bottom vertical level in a vertical direction and bonded to the first bottom die; a second top die disposed at the top vertical level and bonded to the second bottom die; and a linking die disposed at the top vertical level and bonded to both the first bottom die and the second bottom die. The linking die is characterized by a polygonal shape in a horizontal plane perpendicular to the vertical direction, and the polygonal shape is not a rectangle.

20 Claims, 17 Drawing Sheets

(56) References Cited

U.S. PATENT DOCUMENTS

| | | | |
|---|---|---|---|
| 11,049,830 B2* | 6/2021 | Marquart | H01L 24/81 |
| 11,410,971 B2* | 8/2022 | Tseng | H01L 23/481 |
| 11,545,438 B2* | 1/2023 | Hsieh | H01L 24/20 |
| 12,205,939 B2* | 1/2025 | Lee | H01L 25/0652 |
| 2004/0006883 A1* | 1/2004 | Wu | H01L 21/67775 |
| | | | 33/645 |
| 2007/0043894 A1* | 2/2007 | Zingher | H01L 23/50 |
| | | | 257/E23.079 |
| 2011/0042824 A1* | 2/2011 | Koide | H01L 21/76898 |
| | | | 257/784 |
| 2013/0026609 A1* | 1/2013 | Wu | H01L 23/49827 |
| | | | 257/632 |
| 2015/0364422 A1* | 12/2015 | Zhai | H01L 21/768 |
| | | | 257/773 |
| 2016/0066422 A1* | 3/2016 | Sakamoto | H05K 1/181 |
| | | | 361/767 |
| 2016/0079169 A1 | 3/2016 | Uzoh et al. | |
| 2016/0268205 A1 | 9/2016 | Uzoh et al. | |
| 2016/0379959 A1* | 12/2016 | We | H01L 23/3114 |
| | | | 257/773 |
| 2018/0077801 A1* | 3/2018 | Kulick | H05K 1/181 |
| 2020/0258838 A1* | 8/2020 | Ghosh | H01L 23/5381 |
| 2020/0273803 A1* | 8/2020 | Hsu | H01L 25/0652 |
| 2020/0357744 A1* | 11/2020 | Yong | H01L 23/481 |
| 2021/0020389 A1* | 1/2021 | Henke | H01H 33/593 |
| 2021/0020529 A1* | 1/2021 | McHerron | H01L 23/538 |
| 2021/0134724 A1* | 5/2021 | Rubin | H01L 23/5385 |
| 2021/0143115 A1 | 5/2021 | Wu et al. | |
| 2021/0159141 A1* | 5/2021 | Sikka | H01L 23/053 |
| 2021/0202389 A1* | 7/2021 | Hsieh | H01L 24/96 |
| 2021/0320040 A1* | 10/2021 | Fu | H01L 25/0655 |
| 2022/0051985 A1* | 2/2022 | Agarwal | H01L 25/0657 |
| 2022/0084969 A1* | 3/2022 | Colgan | H01L 23/544 |
| 2022/0157727 A1* | 5/2022 | Farooq | H01L 23/5385 |
| 2022/0359483 A1* | 11/2022 | Hung | H01L 25/50 |
| 2022/0406752 A1* | 12/2022 | Wang | H01L 23/3185 |
| 2023/0051337 A1* | 2/2023 | Horibe | H01L 21/561 |
| 2023/0154854 A1* | 5/2023 | Farooq | H01L 24/73 |
| | | | 257/690 |
| 2023/0187430 A1* | 6/2023 | Funaki | H01L 25/18 |
| | | | 257/618 |
| 2023/0245871 A1* | 8/2023 | Nagaike | H01L 21/67201 |
| | | | 134/1 |
| 2023/0245971 A1* | 8/2023 | Mok | H01L 21/4857 |
| | | | 257/690 |
| 2023/0290730 A1* | 9/2023 | Chang Chien | H01L 21/4857 |
| 2023/0299007 A1* | 9/2023 | Dabral | H01L 23/5381 |
| 2023/0317536 A1* | 10/2023 | Seidemann | H01L 23/5381 |
| | | | 257/738 |
| 2023/0378072 A1* | 11/2023 | Liu | H01L 25/0655 |
| 2024/0006323 A1* | 1/2024 | Wang | H01L 25/0655 |
| 2024/0332276 A1* | 10/2024 | Funaki | H01L 25/0655 |

* cited by examiner

SEMICONDUCTOR DIE ASSEMBLY HAVING A POLYGONAL LINKING DIE

FIELD

Embodiments of the present disclosure relate generally to semiconductor packaging, and more particularly to semiconductor package structure including polygonal linking dies.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
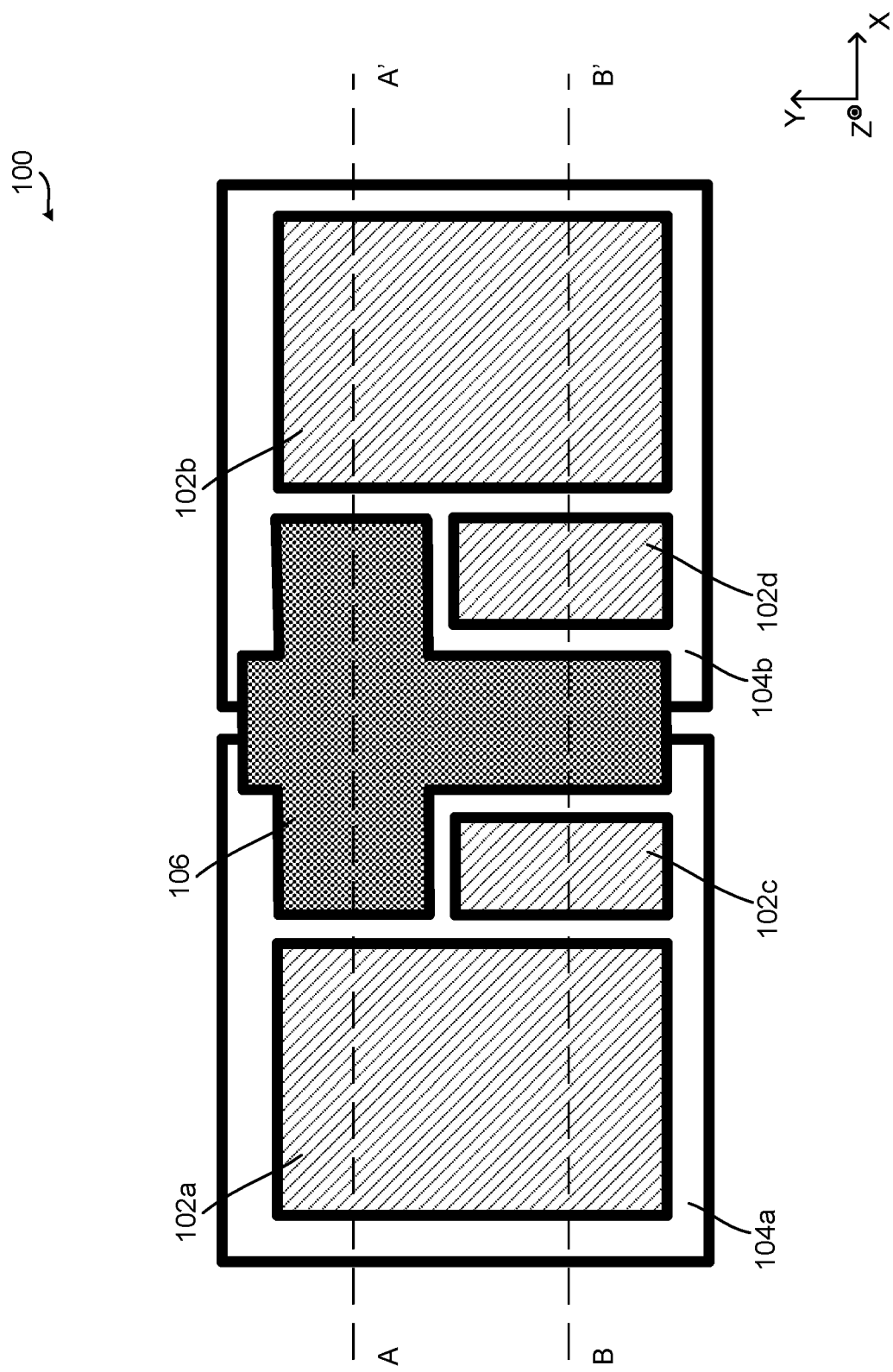
FIG. 1A is a schematic diagram illustrating a top view of an example semiconductor die assembly in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

Integrated Fan-Out (InFO) is another wafer-level packaging technology. InFO is a packaging technology that incorporates high-density redistribution layer (RDL) and through InFO via (TIV) for high-density interconnect and performance for various applications, such as mobile devices, high performance computing, etc. A wafer is typically diced into individual known good dies (KGDs) after testing, and the KGDs are placed on a temporary carrier with certain distance apart. RDLs are formed subsequently to enable higher number of external contacts without increasing the size of KGDs.

On the other hand, those multiple chips that are bonded to the interposer in a CoWoS structure or embedded in an InFO structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding.

Stacking dies featuring ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

Dies are diced using wafer dicing processes such as mechanical sawing or laser cutting. After wafer dicing processes, dies are conventionally rectangular. Linking chips (sometimes also referred to as "connection chips"), which are used to electrically connect two dies, are conventionally rectangular as well. For example, local silicon interconnect (LSI) chips are conventionally rectangular. Since dies vary in size, rectangular dies do not always utilize the whole area at a certain vertical level (e.g., a top vertical level where multiple top dies are located, a bottom vertical level where multiple bottom dies are located). In other words, there are certain unoccupied areas (sometimes also referred to as "nonoverlapping areas" or "gaps") at a certain vertical level.

In accordance with some aspects of the disclosure, various semiconductor die assemblies (sometimes referred to as "die assemblies") and semiconductor package structures are provided. In order to utilize the unoccupied or nonoverlapping areas mentioned above, a polygonal linking die is introduced into the die assembly. The polygonal linking die is not rectangular. The polygonal linking die is disposed at a top vertical level where the top dies are located. The polygonal linking die is disposed on two different bottom dies. In one embodiment, the polygonal linking die is bonded to both bottom dies using hybrid bonding.

Plasma dicing enables or unleashes the possibility of fabricating polygonal dies. The polygonal linking die operates to increase vertical electrical connection points within the die assembly because the conventionally unoccupied or nonoverlapping area at the top vertical level can be utilized to form vertical electrical connection points using, for example, hybrid bonding structures. The utilization of the chip area is increased accordingly. Details of various aspects of the disclosure will be described below with reference to FIGS. 1A-12.

Example Semiconductor Die Assembly

Figure 1B:
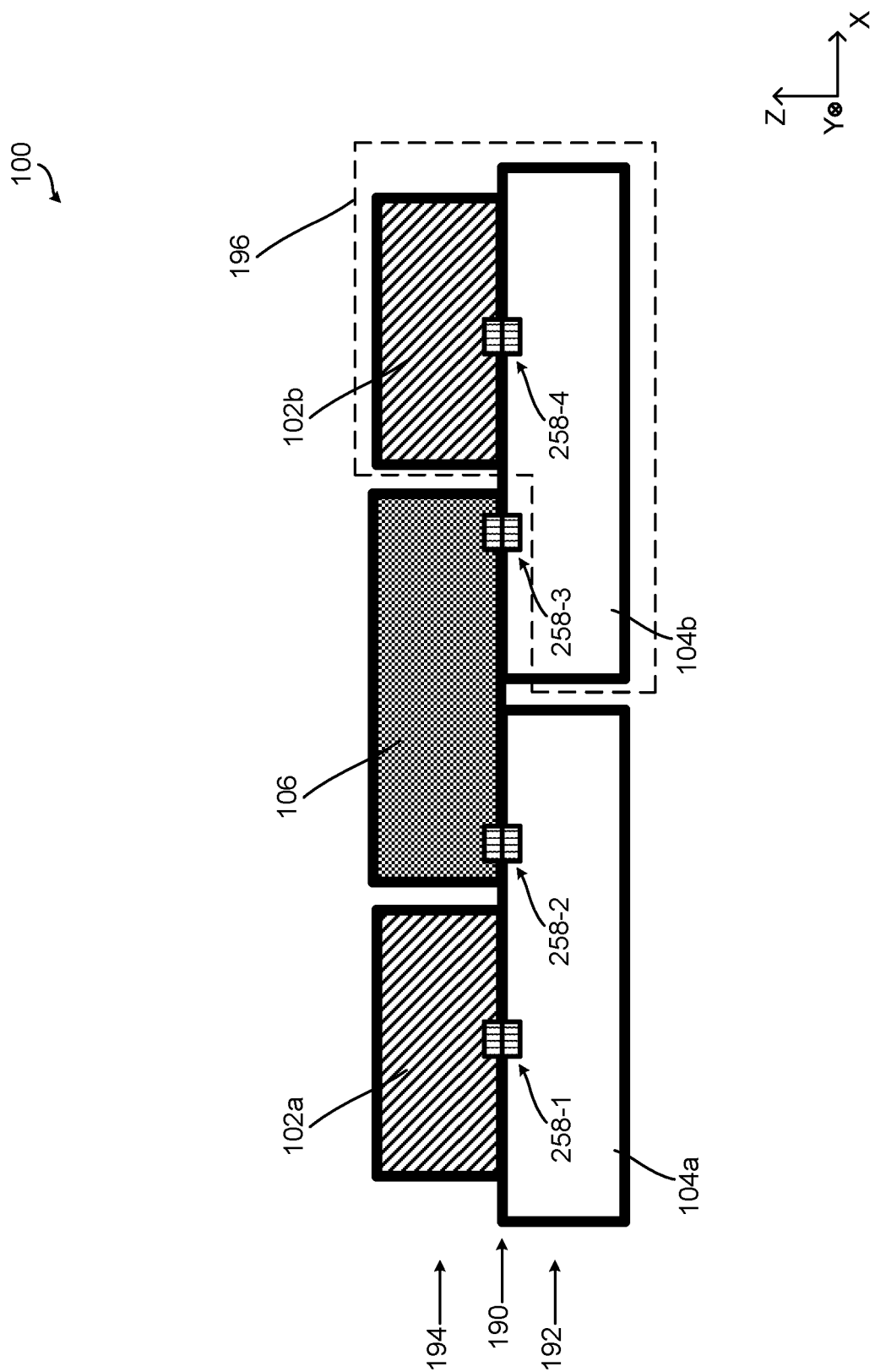
FIG. 1B is a schematic diagram illustrating a cross-sectional view of the example semiconductor die assembly shown in FIG. 1A taken at line A-A' in accordance with some embodiments.
Figure 1C:
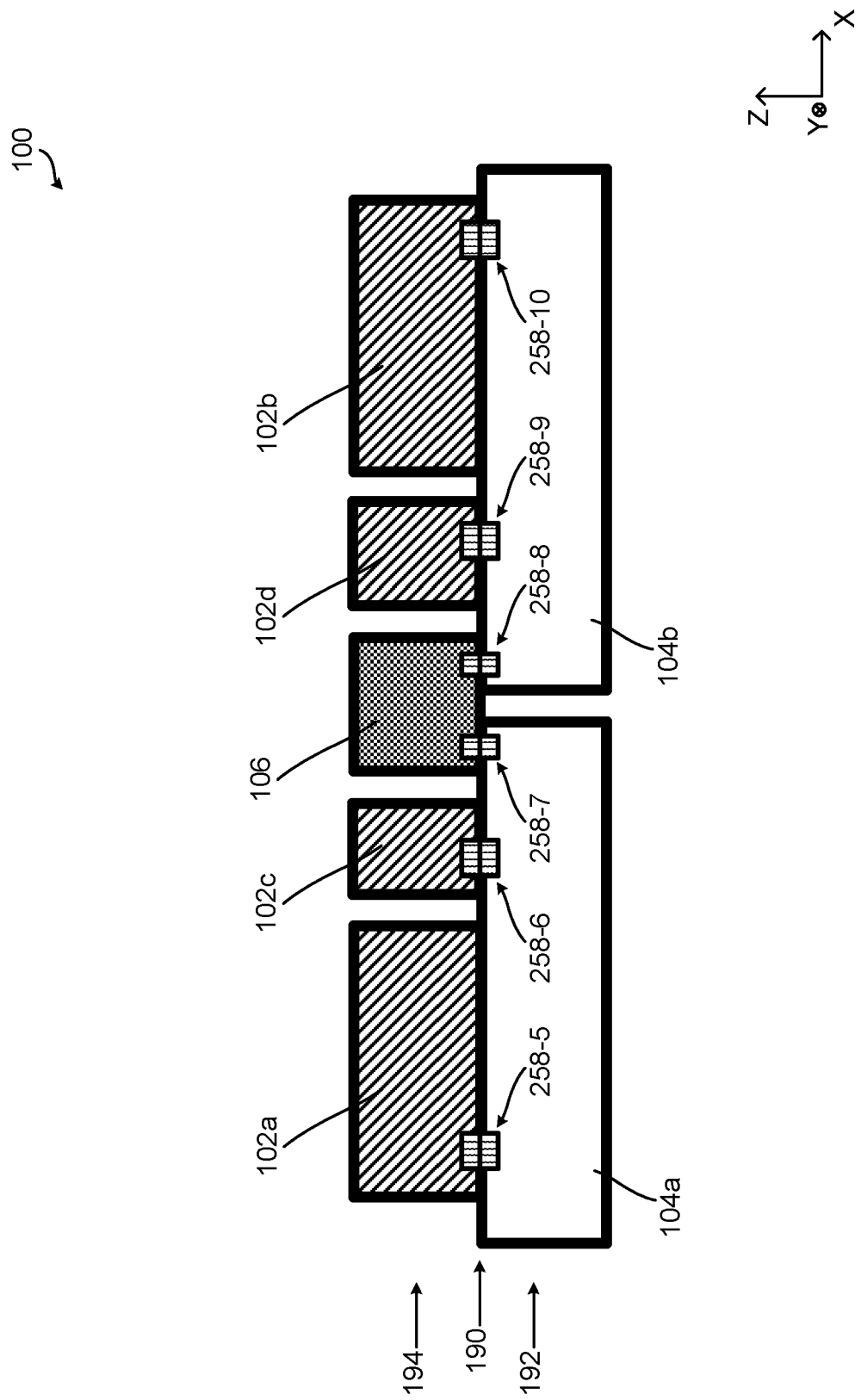
FIG. 1C is a schematic diagram illustrating a cross-sectional view of the example semiconductor die assembly shown in FIG. 1A taken at line B-B' in accordance with some embodiments.

FIG. 1A is a schematic diagram illustrating a top view of an example semiconductor die assembly (also referred to as "die assembly") 100 in accordance with some embodiments. FIG. 1B is a schematic diagram illustrating a cross-sectional view of the example semiconductor die assembly 100 taken at line A-A' in accordance with some embodiments. FIG. 1C is a schematic diagram illustrating a cross-sectional view of the example semiconductor die assembly 100 taken at line B-B' in accordance with some embodiments. It should be understood that FIGS. 1A-1C are not drawn to scale.

As shown in FIGS. 1A-1C, the die assembly 100 includes, among other components, two bottom dies 104a and 104b, four top dies 102a, 102b, 102c, and 102d, and a polygonal linking die 106. The bottom dies 104a and 104b are disposed at the same vertical level (e.g., a bottom vertical level 192 shown in FIGS. 1B and 1C). In other words, the bottom dies 104a and 104b are aligned in the vertical direction (i.e., the Z-direction shown in FIG. 1A). The bottom dies 104a and 104b are lateral to each other in a first horizontal direction (i.e., the X-direction shown in FIG. 1).

The top dies 102a, 102b, 102c, and 102d are disposed at the same vertical level (e.g., a top vertical level 194 shown in FIGS. 1B and 1C). In other words, the top dies 102a, 102b, 102c, and 102d are aligned in the Z-direction shown in FIG. 1. In the example shown in FIG. 1A, the top dies 102a and 102c are disposed on the bottom die 104a, whereas the top dies 102b and 102d are disposed on the bottom die 104b. It should be understood that fewer or more top dies can be disposed on the bottom die 104a or on the bottom die 104b in other embodiments.

As shown in FIG. 1B, the top die 102a is bonded to the bottom die 104a using hybrid bonding, featuring a hybrid bonding structure 258-1 formed in bonding layers on both sides of the bonding interface 190; the top die 102b is bonded to the bottom die 104b using hybrid bonding, featuring a hybrid bonding structure 258-4 formed in bonding layers on both sides of the bonding interface 190. Each of the hybrid bonding structures 258-1 and 258-4 includes two hybrid bonding metal pads on two sides of the bonding interface 190, respectively.

As shown in FIG. 1C, the top die 102a is bonded to the bottom die 104a using hybrid bonding, featuring a hybrid bonding structure 258-5 formed in bonding layers on both sides of the bonding interface 190; the top die 102b is bonded to the bottom die 104b using hybrid bonding, featuring a hybrid bonding structure 258-10 formed in bonding layers on both sides of the bonding interface 190; the top die 102c is bonded to the bottom die 104a using hybrid bonding, featuring a hybrid bonding structure 258-6 formed in bonding layers on both sides of the bonding interface 190; the top die 102d is bonded to the bottom die 104b using hybrid bonding, featuring a hybrid bonding structure 258-9 formed in bonding layers on both sides of the bonding interface 190. Likewise, each of the hybrid bonding structures 258-5, 258-6, 258-9, and 258-10 includes two hybrid bonding metal pads on two sides of the bonding interface 190, respectively.

The hybrid bonding structures 258-1, 258-4, 258-5, 258-6, 258-9, and 258-10 (collectively "258") allow for electrical connections in the Z-direction between one of the bottom dies 104a and 104b and one of the top dies 102a-102d. Details of the hybrid bonding structures 258-1, 258-4, 258-5, 258-6, 258-9, and 258-10 will be described below with reference to FIG. 2. Although certain numbers of hybrid bonding structures 258 (e.g., one, two, etc.) are shown in FIGS. 1B and 1C between one of the bottom dies 104a and 104b and one of the top dies 102a-102d, it should be understood that more or fewer hybrid bonding structures 258 can be employed in other embodiments. An example of the region 196 of the die assembly 100 shown in FIG. 1B will be illustrated and described below with reference to FIG. 2.

The top dies 102a, 102b, 102c, and 102d are lateral to each other in the X-direction shown in FIG. 1. In other embodiments, the top dies 102a, 102b, 102c, and 102d may be lateral to each other in a second horizontal direction (i.e., the Y-direction shown in FIG. 1) perpendicular to the first horizontal direction. In yet other embodiments, the top dies 102a, 102b, 102c, and 102d may be lateral to each other in both the X-direction and the Y-direction. In other words, the top dies 102a, 102b, 102c, and 102d are distributed in the horizontal plane (i.e., the X-Y plane shown in FIG. 1A), subject to design rules such as the minimum distance(s) between two neighboring dies in both the X-direction and the Y-direction.

As mentioned above, the top dies 102a, 102b, 102c, and 102d are conventionally rectangular and vary in size. Therefore, the top dies 102a, 102b, 102c, and 102d do not always utilize the entire area at the top vertical level 194 shown in FIGS. 1B and 1C. In other words, there are certain unoccupied areas (sometimes also referred to as "nonoverlapping areas" or "gaps") at the top vertical level 194 due to the rectangular shapes of the top dies 102a, 102b, 102c, and 102d.

In order to utilize these unoccupied or nonoverlapping areas, the polygonal linking die 106 is introduced into the die assembly 100. The polygonal linking die 106 is disposed at the top vertical level 194 and on both the bottom die 104a and the bottom die 104b. The polygonal linking die 106 is not rectangular. In some embodiments that will be discussed below with reference to FIGS. 9A-9D, the polygonal linking die 106 may have various shapes, such as a "cross" shape, a "T" shape, or an "H" shape. As shown in FIG. 1B, the polygonal linking die 106 is bonded to the bottom die 104a, featuring a hybrid bonding structure 258-2 formed in bonding layers on both sides of the bonding interface 190; the polygonal linking die 106 is bonded to the bottom die 104b, featuring a hybrid bonding structure 258-3 formed in bonding layers on both sides of the bonding interface 190. As shown in FIG. 1C, the polygonal linking die 106 is bonded to the bottom die 104a, featuring a hybrid bonding structure 258-7 formed in bonding layers on both sides of the bonding interface 190; the polygonal linking die 106 is bonded to the bottom die 104b, featuring a hybrid bonding structure 258-8 formed in bonding layers on both sides of the bonding interface 190.

Similarly, each of the hybrid bonding structures 258-2, 258-3, 258-7, and 258-8 includes two hybrid bonding metal pads on two sides of the bonding interface 190, respectively. Details of the hybrid bonding structures 258-2, 258-3, 258-7, and 258-8 will be described below with reference to FIG. 2. Although certain numbers of hybrid bonding structures 258 (e.g., one, two, etc.) are shown in FIGS. 1B and 1C between the polygonal linking die 106 and one of the bottom dies 104a and 104b, it should be understood that more or fewer hybrid bonding structures 258 can be employed in other embodiments.

The polygonal linking die 106 is electrically connected to the bottom die 104a through, for example, the hybrid bonding structures 258-2 and 258-7. The polygonal linking die 106 is electrically connected to the bottom die 104b through, for example, the hybrid bonding structures 258-3 and 258-8. Since the polygonal linking die 106 includes a multilayer interconnect (MLI) structure that allows for routing signals and/or distributing signals as needed, the bottom die 104a and the bottom die 104b are electrically connected through the polygonal linking die 106. In other words, the polygonal linking die 106 operates to "bridge" the bottom die 104a and the bottom die 104b. As a result, the top dies 102a and 102c are electrically connected to the top dies 102b and 102d through the polygonal linking die 106 and the bottom dies 104a and 104b. As such, all components in the die assembly 100 are electrically connected or linked.

The polygonal linking die 106 operates to increase vertical electrical connection points within the die assembly 100 because these conventionally unoccupied or nonoverlapping areas at the top vertical level 194 can be utilized to form vertical electrical connection points using, for example, hybrid bonding structures 258.

The MLI structure, in one implementation, includes a combination of dielectric layers and conductive layers configured to form various interconnect structures. The conductive layers are configured to form vertical interconnect features (e.g., vias, etc.) and horizontal interconnect features (e.g., conductive lines extending in the X-Y plane). Vertical interconnect features typically connect horizontal interconnect features in different layers (e.g., a first metal layer often denoted as "M1" and a fifth metal layer often denoted as "M5") of the MLI structure. The MLI structure is configured to route signals and/or distribute signals (e.g., clock signals, voltage signals, ground signals, etc.) to one or more of the bottom dies 104a and 104b. In some embodiments, the polygonal linking die 106 may include semiconductor devices (e.g., passive devices, active devices, etc.) in addition to the MLI structure.

Example Die Stack Featuring Hybrid Bonding

Figure 2:
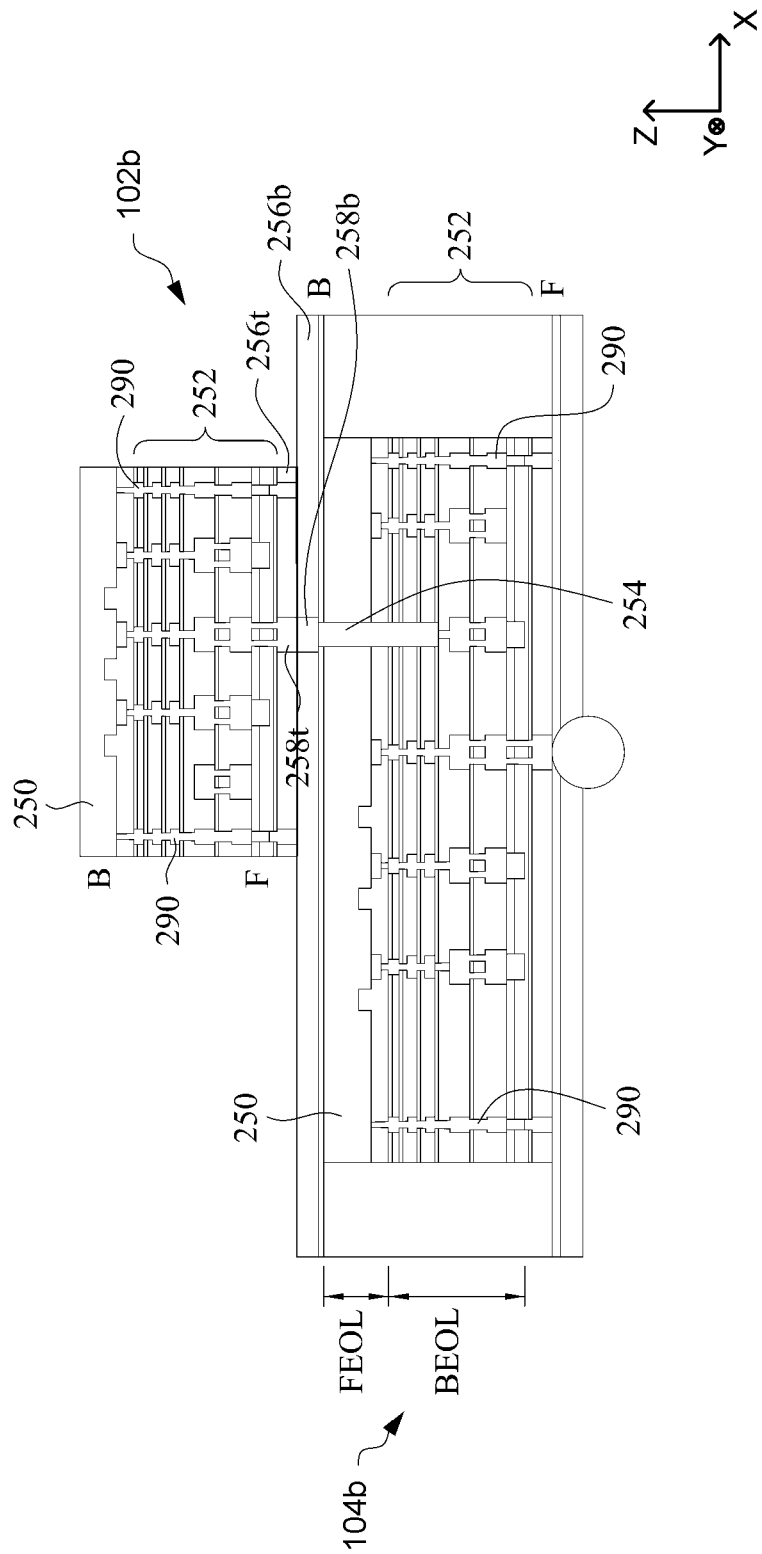
FIG. 2 is a diagram illustrating the region 196 shown in FIG. 1B in accordance with some embodiments.

FIG. 2 is a diagram illustrating the region 196 shown in FIG. 1B in accordance with some embodiments. In the example shown in FIG. 2, the bottom die 104b has a front side (denoted as "F" in FIG. 2) and a back side (denoted as "B" in FIG. 2). In the example shown in FIG. 2, the bottom die 104b has been flipped, i.e., upside down. A bonding layer 256b (here "b" stands for "bottom") is formed at the back side and on a silicon substrate 250. In one implementation, the bonding layer 256b is made of a dielectric and can be used for bonding with another bonding layer 256t (here "t" stands for "top") at the top die 102b.

One or more semiconductor devices (e.g., transistors, resistors, capacitors, inductors, etc.) are formed on the silicon substrate 250, before being flipped, in a front-end-of-line (FEOL) process. A multilayer interconnect (MLI) structure 252 is disposed over the one or more semiconductor devices, before being flipped. The MLI structure 252 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 252. During operation of bottom die 104b, the interconnect structures are configured to route signals and/or distribute signals (e.g., clock signals, voltage signals, ground signals) to the one or more semiconductor devices to fulfill certain functions. It should be understood that although the MLI structure 252 is depicted in FIG. 2 with a given number of dielectric layers and conductive layers, the present disclosure contemplates MLI structures having more or fewer dielectric layers and/or conductive layers depending on design requirements of the bottom die 104b.

In the example shown in FIG. 2, the bottom die 104b includes a hybrid bonding metal pad 258b formed in the bonding layer 256b, and the hybrid bonding metal pad 258b is connected to the MLI structure 252 through a through-silicon via (TSV) 254, which penetrates the silicon substrate 250 in the vertical direction (i.e., the Z-direction). It should be understood that although only one hybrid bonding metal pad 258b and one TSV 254 is shown in FIG. 2, this is not intended to be limiting. In other examples, there are many hybrid bonding metal pads 258b and corresponding TSVs 254, with small critical dimensions and pitches, thus achieving better interconnect density and performance (e.g., faster speeds, higher bandwidth, and the like).

A seal ring 290 is a metallization structure that is located between and separates the core circuitry of the bottom die 104b and the peripheral regions (or edges) of the bottom die 104b. The seal ring 290 surrounds the core circuitry in the X-Y plane and prevents the intrusion of cracks and moisture penetration or chemical damage like acid, alkaline containing or diffusion of contaminating species.

Likewise, the top die 102b has a front side (denoted as "F" in FIG. 2) and a back side (denoted as "B" in FIG. 2). In the example shown in FIG. 2, the top die 102b has been flipped, i.e., upside down. A bonding layer 256t ("t" stands for "top") is formed at the front side and over a MLI structure 252, before the top die 102b is flipped. In one implementation, the bonding layer 256t is made of a dielectric and can be used for bonding with the bonding layer 256b at the bottom die 104b, as mentioned above. Likewise, the top die 102b includes a hybrid bonding metal pad 258t ("t" stands for "top") formed in the bonding layer 256t, and the hybrid bonding metal pad 258t is connected to the MLI structure 252 through, for example, a via. It should be understood that although only one hybrid bonding metal pad 258t and one TSV 254 are shown in FIG. 2, this is not intended to be limiting. In other examples, there are many hybrid bonding metal pads 258t and corresponding TSVs 254, with small critical dimensions and pitches, thus achieving better interconnect density and performance (e.g., faster speeds, higher bandwidth, and the like).

For die-to-die bonding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die bonding or die-to-wafer bonding. A pick-and-place system is an automatic system that can pick a top die and place it onto the bottom die or a host wafer, often in a high-speed manner.

While the region 196 is illustrated and described in detail with reference to FIG. 2, one of ordinary skill in the art would appreciate how the bottom dies 104a and 104b are bonded to the top dies 102a-102d and the polygonal linking die 106 using hybrid bonding.

Various Configurations of the Example Semiconductor Die Assembly

The die assembly 100 shown in FIGS. 1A-1C can be employed in various configurations. Some exemplary configurations are described below with reference to FIGS. 3-7. It should be understood that other configurations may be employed in other embodiments.

Figure 3:
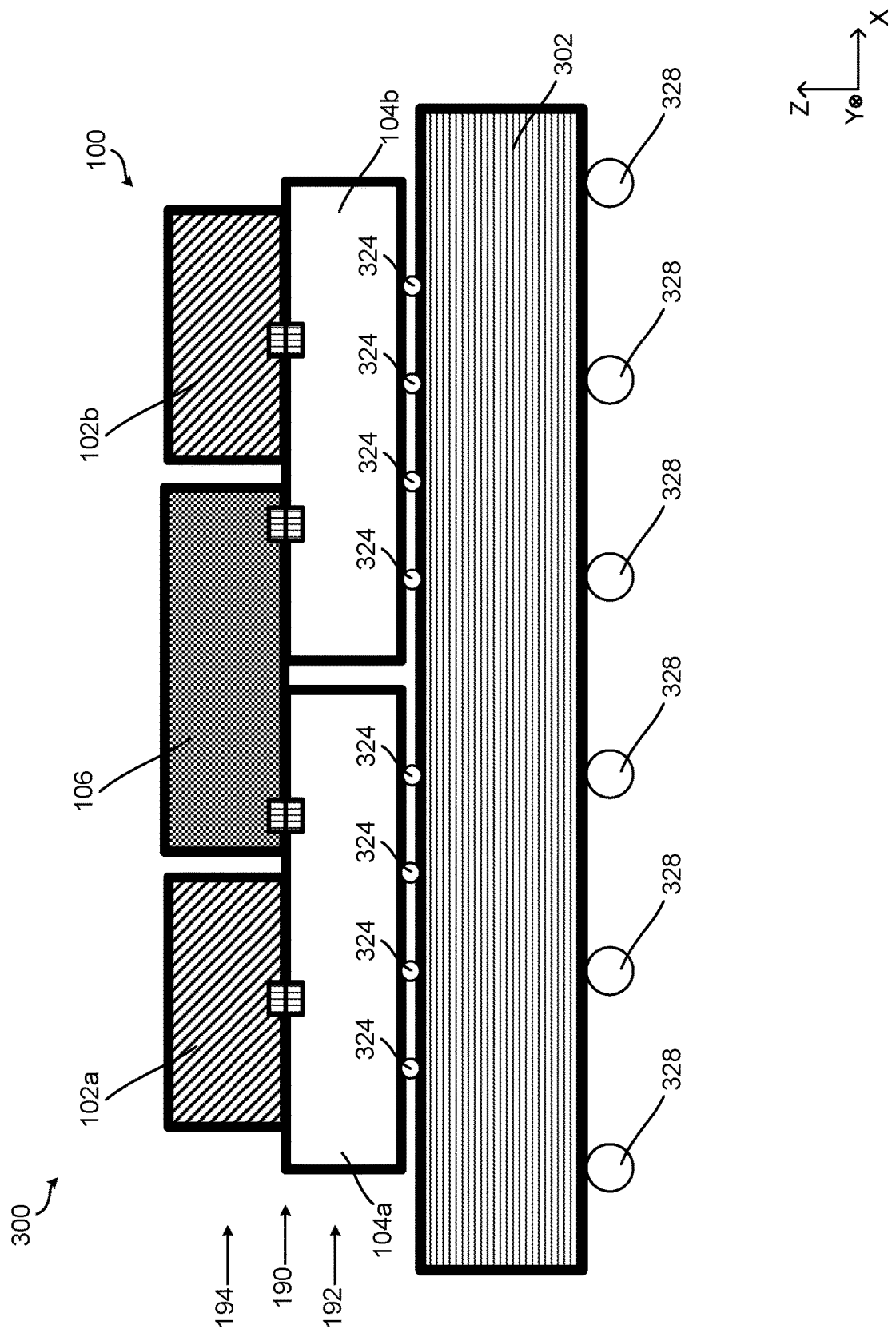
FIG. 3 is a diagram illustrating an example configuration of the example semiconductor die assembly shown in FIGS. 1A-1C in accordance with some embodiments.

FIG. 3 is a diagram illustrating an example configuration of the example semiconductor die assembly 100 shown in FIGS. 1A-1C in accordance with some embodiments. In the example shown in FIG. 3, a semiconductor package 300 includes, among other components, the die assembly 100 shown in FIGS. 1A-1C and a package substrate 302. The die assembly 100 is bonded to the package substrate 302 using, for example, micro-bumps (i.e., μBumps) 324. Specifically, the bottom die 104a and the bottom die 104b are bonded to the package substrate 302, which is below the bottom dies 104a and 104b in the Z-direction.

The package substrate 302 includes interconnect structures that provide electrical connections between the micro-bumps 324 on its top surface and the package balls 328 on its bottom surface. In some examples, the package substrate 302 can be bonded to a printed circuit board (PCB) using package balls 328. In other examples, the package substrate 302 can be bonded to a power node of a power source such as a power supply and a ground node of the power source.

Figure 4:
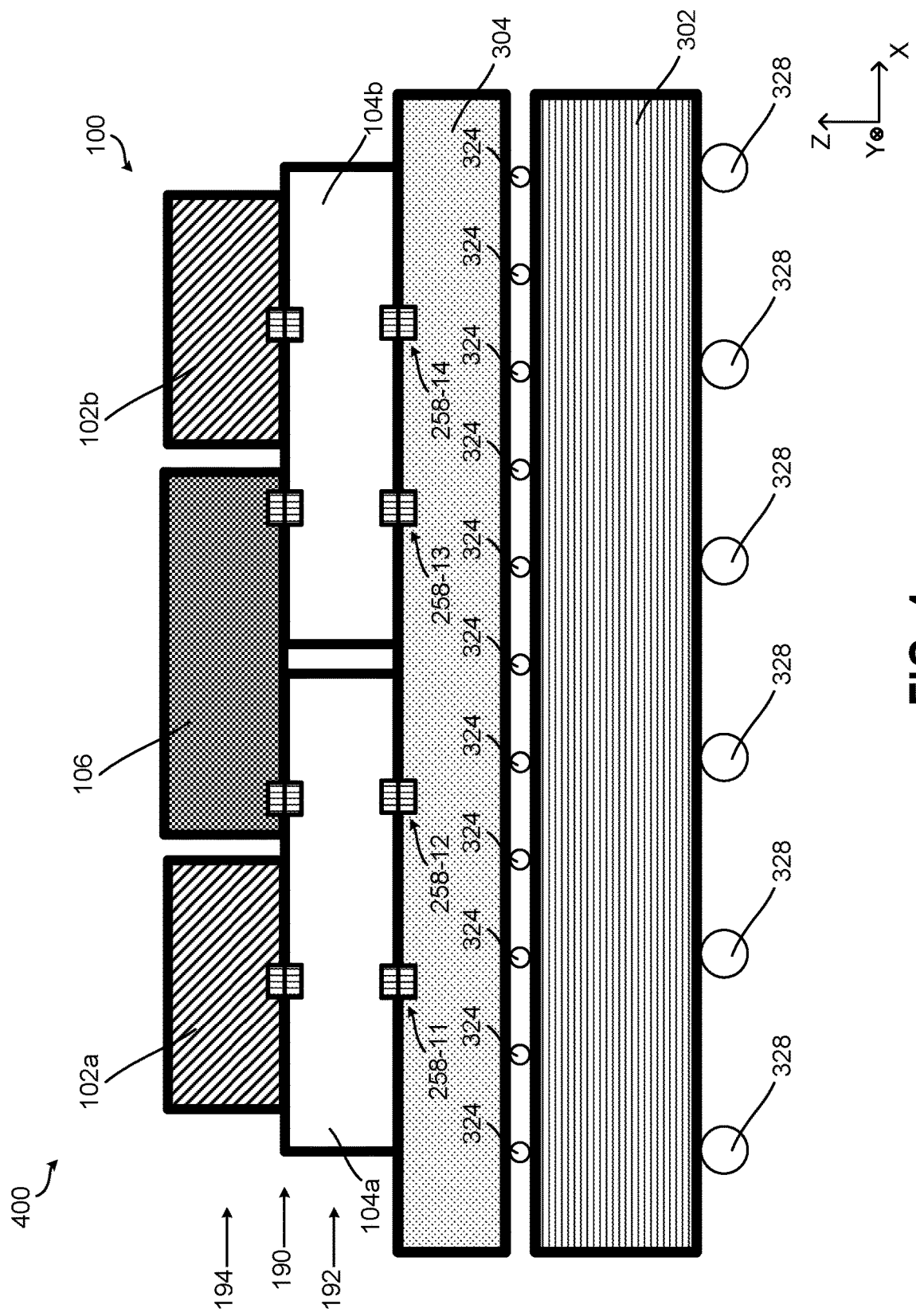
FIG. 4 is a diagram illustrating another example configuration of the example semiconductor die assembly shown in FIGS. 1A-1C in accordance with some embodiments.

FIG. 4 is a diagram illustrating another example configuration of the example semiconductor die assembly 100 shown in FIGS. 1A-1C in accordance with some embodiments. In the example shown in FIG. 4, a semiconductor package 400 includes, among other components, the die assembly 100 shown in FIGS. 1A-1C, a silicon chip (sometimes also referred to as "silicon die") 304, and a package substrate 302. The die assembly 100 is bonded to the silicon chip 304 using hybrid bonding, featuring hybrid bonding structures 258-11, 258-12, 258-13, and 258-14. In one implementation, the silicon chip 304 includes interconnect structures (e.g., MLI structures and TSVs). The interconnect structures in the silicon chip 304 provide electrical connections between the bottom dies 104a and 104b and electrical connections between the package substrate 302 and the bottom dies 104a and 104b.

In another implementation, the silicon chip 304 includes the interconnect structures and multiple deep trench capacitors (DTCs). The DTCs are characterized by high aspect ratios (e.g., larger than one hundred). The DTCs located in the silicon chip 304 can add capacitance to the die assembly 100.

In yet another implementation, the silicon chip 304 includes semiconductor devices (e.g., passive devices, active devices, etc.) in addition to the interconnect structures. In still another implementation, the silicon chip 304 includes both semiconductor devices (e.g., passive devices, active devices, etc.) and DTCs in addition to the interconnect structures. One of ordinary skill in the art would recognize many variations, modifications, and alternatives.

Similarly, the silicon chip 304 is bonded to the package substrate 302 using, for example, micro-bumps (i.e., pumps) 324 (or C4 copper bumps in other examples). The package substrate 302 includes interconnect structures that provide electrical connections between the micro-bumps 324 on its top surface and the package balls 328 on its bottom surface. In some examples, the package substrate 302 can be bonded to a printed circuit board (PCB) using package balls 328. In other examples, the package substrate 302 can be bonded to a power node of a power source such as a power supply and a ground node of the power source.

Figure 5:
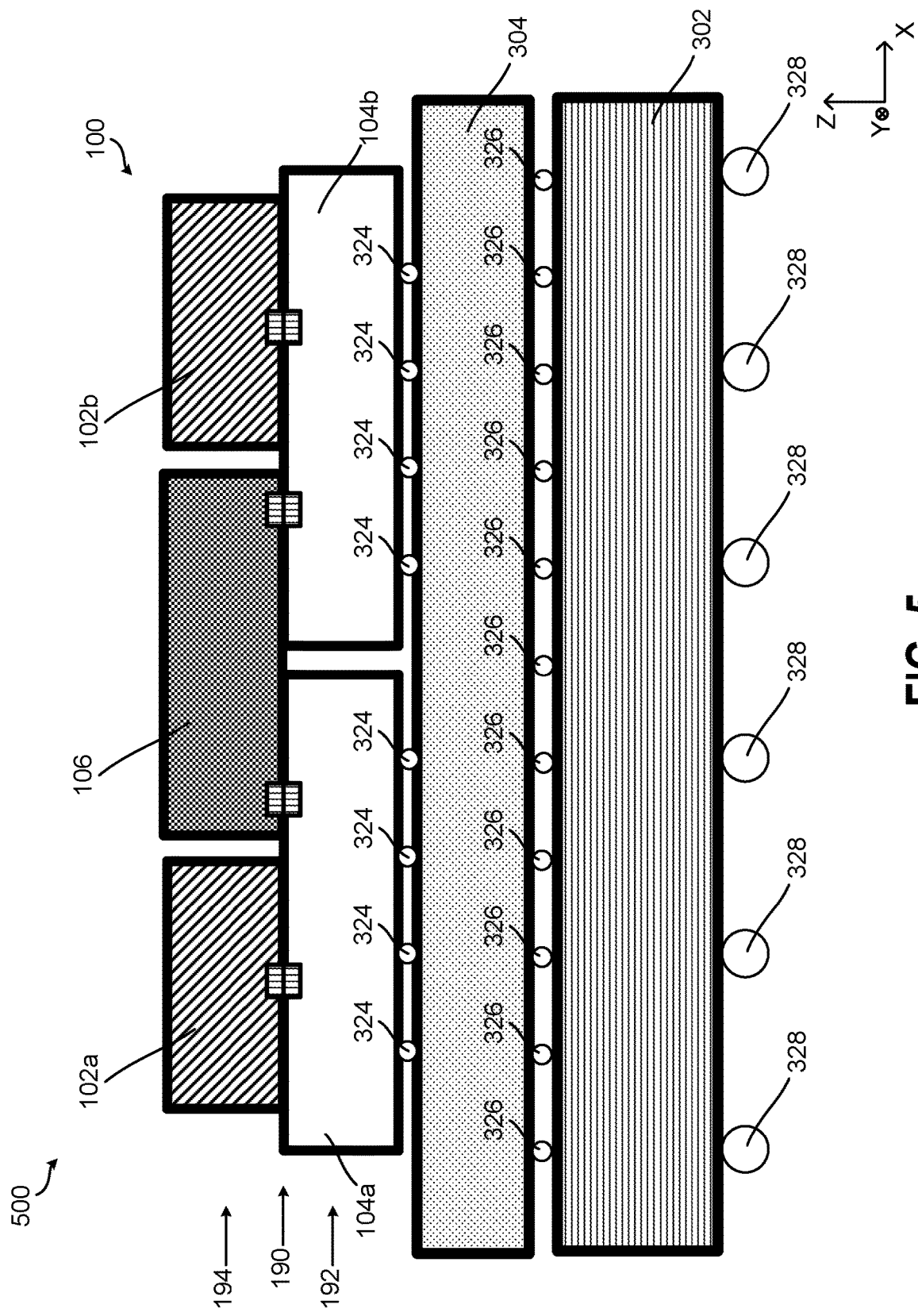
FIG. 5 is a diagram illustrating yet another example configuration of the example semiconductor die assembly shown in FIGS. 1A-1C in accordance with some embodiments.

FIG. 5 is a diagram illustrating yet another example configuration of the example semiconductor die assembly 100 shown in FIGS. 1A-1C in accordance with some embodiments. In the example shown in FIG. 5, a semiconductor package 500 includes, among other components, the die assembly 100 shown in FIGS. 1A-1C, a silicon chip 304, and a package substrate 302. The die assembly 100 is bonded to the silicon chip 304 using, for example, micro-bumps (i.e., pumps) 324. Specifically, the bottom die 104a and the bottom die 104b are bonded to the silicon chip 304, which is below the bottom dies 104a and 104b in the Z-direction.

In one embodiment, the silicon chip 304 includes interconnect structures (e.g., MLI structures and TSVs). In other words, the semiconductor package 500 is a CoWoS package, and the silicon chip 304 is an interposer. The interconnect structures in the silicon chip 304 provide electrical connections between the bottom dies 104a and 104b and electrical connections between the package substrate 302 and the bottom dies 104a and 104b. In some examples, the silicon chip 304 includes the interconnect structures and multiple deep trench capacitors (DTCs). The DTCs are characterized by high aspect ratios (e.g., larger than one hundred). The DTCs located in the silicon chip 304 can add capacitance to the die assembly 100.

In another embodiment, the silicon chip 304 may include semiconductor devices (e.g., passive devices, active devices, etc.) in addition to the interconnect structures and, in some examples, DTCs. One of ordinary skill in the art would recognize many variations, modifications, and alternatives.

Similarly, the silicon chip 304 is bonded to the package substrate 302 using, for example, C4 copper bumps 326 (or micro-bumps in other examples). The package substrate 302 includes interconnect structures that provide electrical connections between the C4 copper bumps 326 on its top surface and the package balls 328 on its bottom surface. In some examples, the package substrate 302 can be bonded to a printed circuit board (PCB) using package balls 328. In other examples, the package substrate 302 can be bonded to a power node of a power source such as a power supply and a ground node of the power source.

Figure 6:
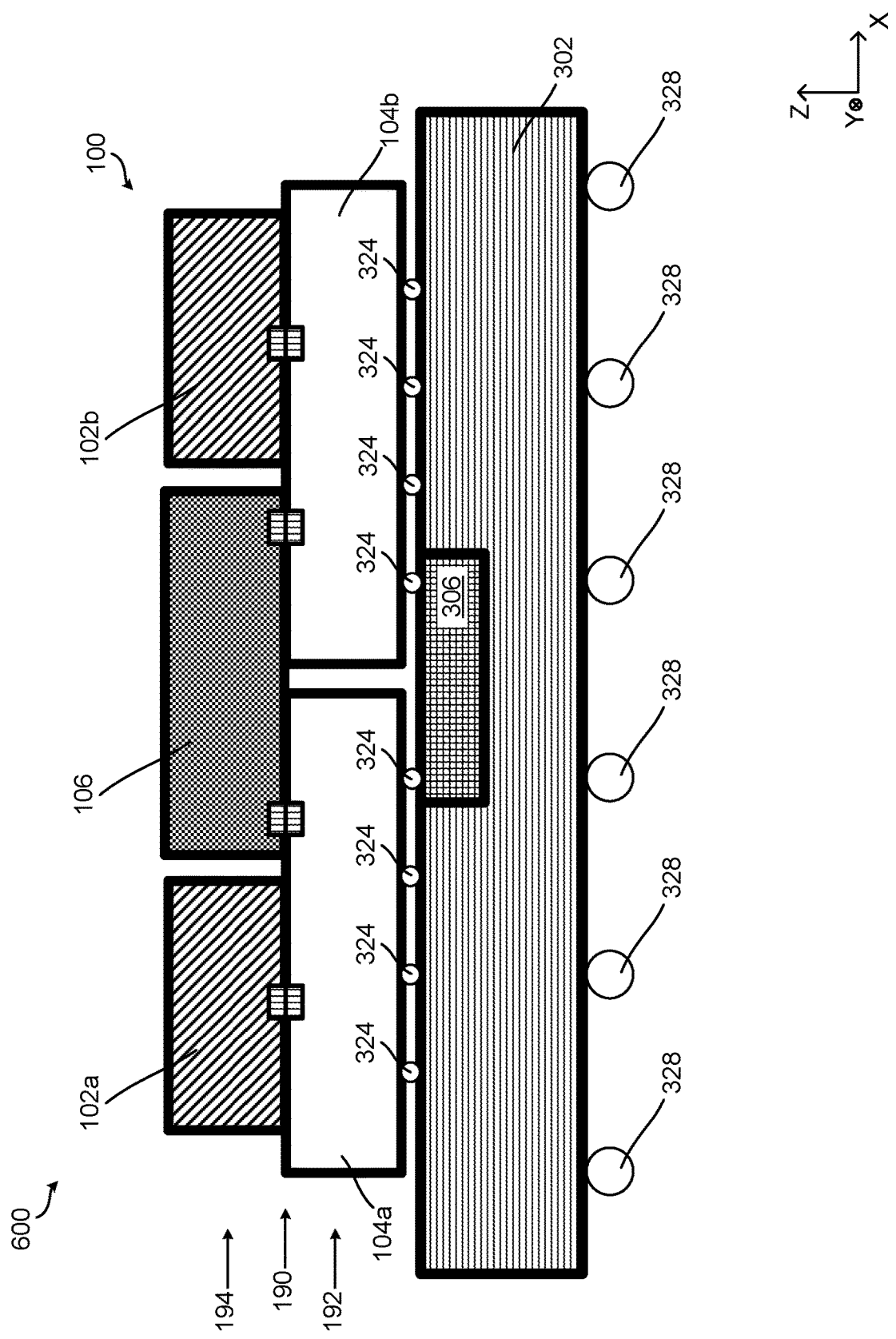
FIG. 6 is a diagram illustrating still another example configuration of the example semiconductor die assembly shown in FIGS. 1A-1C in accordance with some embodiments.

FIG. 6 is a diagram illustrating still another example configuration of the example semiconductor die assembly 100 shown in FIGS. 1A-1C in accordance with some embodiments. The semiconductor package 600 shown in FIG. 6 is identical to the semiconductor package 300 shown in FIG. 3 except that a local silicon interconnect (LSI) chip 306 is embedded in the package substrate 302. The LSI chip 306 includes interconnect structures (e.g., MLI structures, TSVs, etc.) to provide electrical connections between the bottom die 104a and the bottom die 104b. Therefore, the presence of the LSI chip 306 provides the die assembly 100 with extra electrical connection points and routing resources in addition to the polygonal linking die 106.

Figure 7:
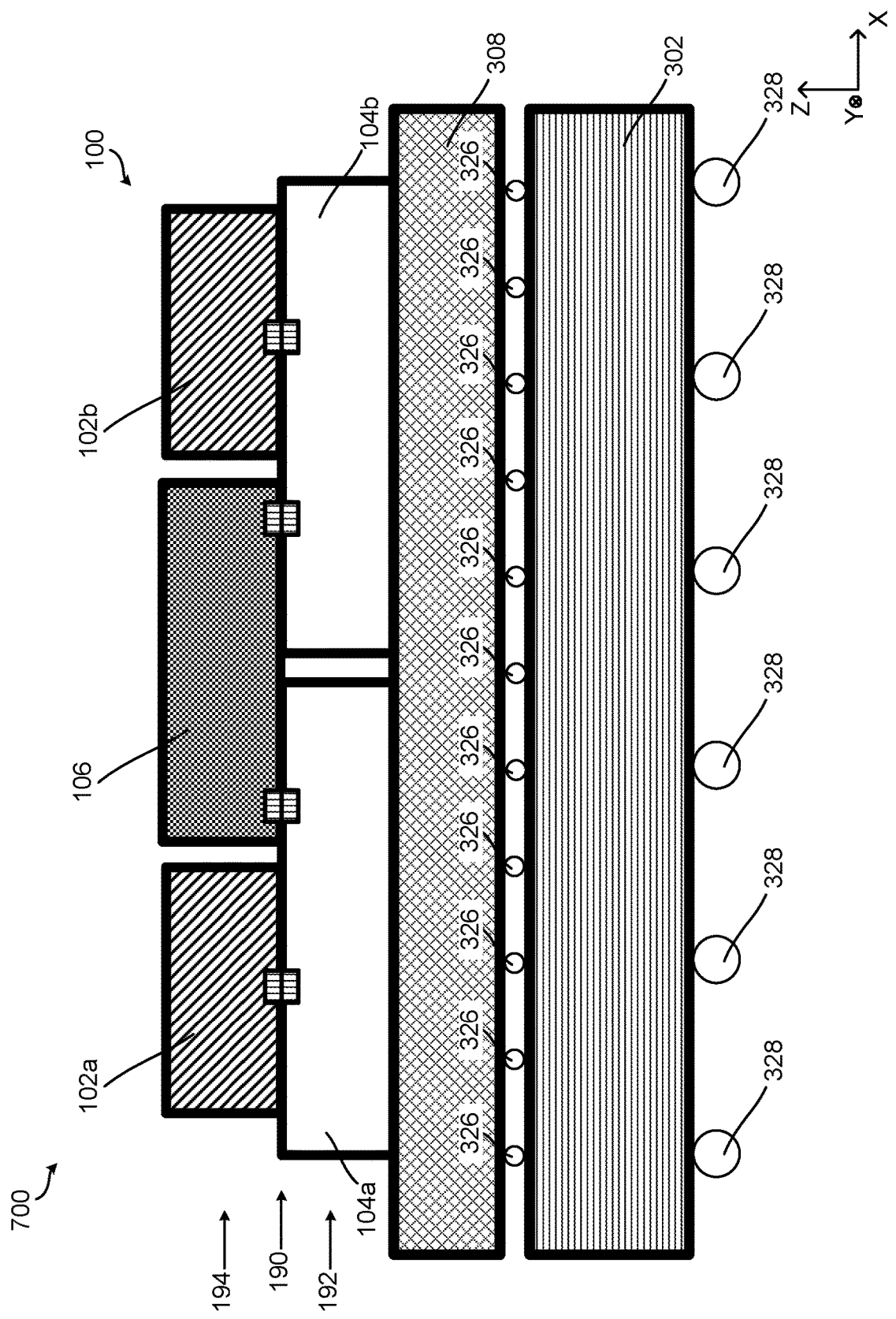
FIG. 7 is a diagram illustrating an example configuration of the example semiconductor die assembly shown in FIGS. 1A-1C in accordance with some embodiments.

FIG. 7 is a diagram illustrating an example configuration of the example semiconductor die assembly 100 shown in FIGS. 1A-1C in accordance with some embodiments. In the example shown in FIG. 7, a semiconductor package 700 includes, among other components, the die assembly 100 shown in FIGS. 1A-1C, a fan-out package structure 308 (e.g., an InFO package structure), and a package substrate 302. The die assembly 100 is bonded to the fan-out package structure 308. Specifically, the bottom die 104a and the bottom die 104b are bonded to the fan-out package structure 308, which is below the bottom dies 104a and 104b in the Z-direction.

In one embodiment, the fan-out package structure 308 includes interconnect structures, such as redistribution layers (RDLs) and through InFO vias (TIVs). In other words, the semiconductor package 700 is using the InFO packaging platform. The interconnect structures in the fan-out package structure 308 provide electrical connections between the bottom dies 104a and 104b and electrical connections between the package substrate 302 and the bottom dies 104a and 104b. In some examples, the fan-out package structure 308 includes at least one die and molding compound surrounding the at least one die. The at least one die includes semiconductor devices (e.g., passive devices, active devices, etc.). In other examples, the fan-out package structure 308 may include integrated passive devices (IPDs) such as resistors, capacitors, inductors, microstrips, and impedance matching elements, and the like.

In one implementation, the bottom die 104a and the bottom die 104b are bonded to the fan-out package structure 308 using, for example, micro-bumps, C4 copper bumps, or solder balls, which are connected to RDLs at the top surface of the fan-out package structure 308.

Similarly, the fan-out package structure 308 is bonded to the package substrate 302 using, for example, C4 copper bumps 326 (or micro-bumps in other examples), which are connected to the RDLs. The package substrate 302 includes interconnect structures that provide electrical connections between the C4 copper bumps 326 on its top surface and the package balls 328 on its bottom surface. In some examples, the package substrate 302 can be bonded to a printed circuit board (PCB) using package balls 328. In other examples, the package substrate 302 can be bonded to a power node of a power source such as a power supply and a ground node of the power source.

Example Fabrication Process and Example Geometries of the Polygonal Linking Die

As explained above, dies are conventionally diced using wafer dicing processes such as mechanical sawing or laser cutting. After wafer dicing processes, dies are conventionally rectangular. Plasma dicing, however, enables or unleashes the possibility of fabricating polygonal dies.

Figure 8A:
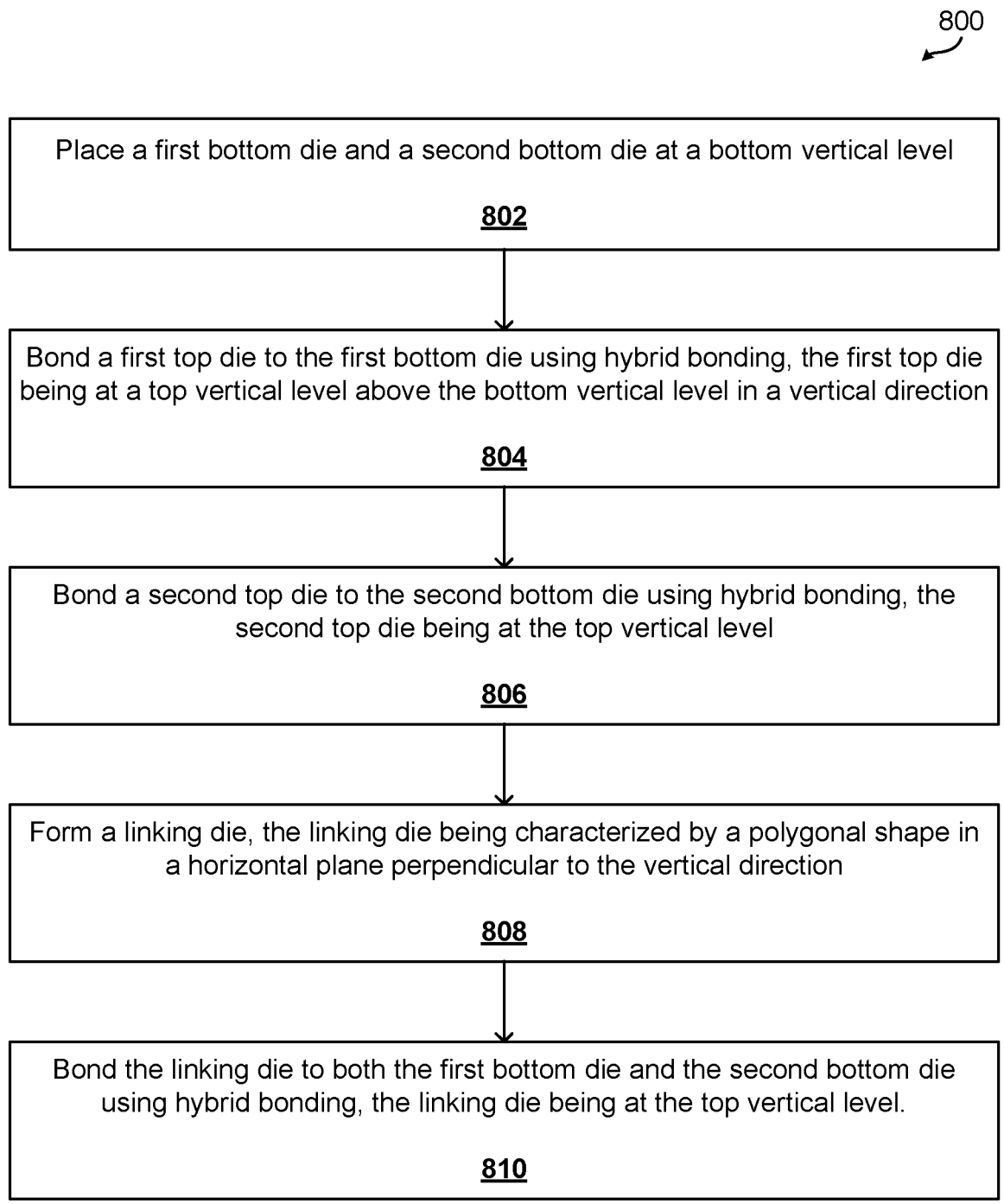
FIG. 8A is a flowchart diagram illustrating an example method for fabricating a (semiconductor) die assembly in accordance with some embodiments.

FIG. 8A is a flowchart diagram illustrating an example method for fabricating a (semiconductor) die assembly in accordance with some embodiments. In the example shown in FIG. 8A, the method 800 includes operations 802, 804, 806, 808, and 810. Additional operations may be performed. Also, it should be understood that the sequence of the various operations discussed above with reference to FIG. 8A is provided for illustrative purposes, and as such, other embodiments may utilize different sequences. For example, operation 808 can be performed before operations 804 and 806. These various sequences of operations are to be included within the scope of embodiments.

At operation 802, a first bottom die (e.g., the bottom die 104a shown in FIG. 1B) and a second bottom die (e.g., the bottom die 104b shown in FIG. 1B) is placed at a bottom vertical level (e.g., the bottom vertical level 192 shown in FIG. 1B).

At operation 804, a first top die (e.g., the top die 102a shown in FIG. 1B) is bonded to the first bottom die using hybrid bonding. The first top die is at a top vertical level (e.g., the top vertical level 194 shown in FIG. 1B) above the bottom vertical level in a vertical direction.

At operation 806, a second top die (e.g., the top die 102b shown in FIG. 1B) is bonded to the second bottom die using hybrid bonding. The second top die is at the top vertical level.

At operation 808, a linking die (e.g., the polygonal linking die 106) is formed. The linking die is characterized by a polygonal shape in a horizontal plane (e.g., the X-Y plane shown in FIG. 1A) perpendicular to the vertical direction. The polygonal shape is not a rectangle. An example operation 808 is described below with reference to FIG. 8B. In one implementation, the polygonal shape is determined based at least on geometries of the first top die and the second top die. In one implementation, the polygonal shape is determined such that the total unoccupied or nonoverlapping area at the top vertical level is minimized, subject to design rules.

At operation 810, the linking die is bonded to both the first bottom die and the second bottom die using hybrid bonding. The linking die is at the top vertical level.

Figure 8B:
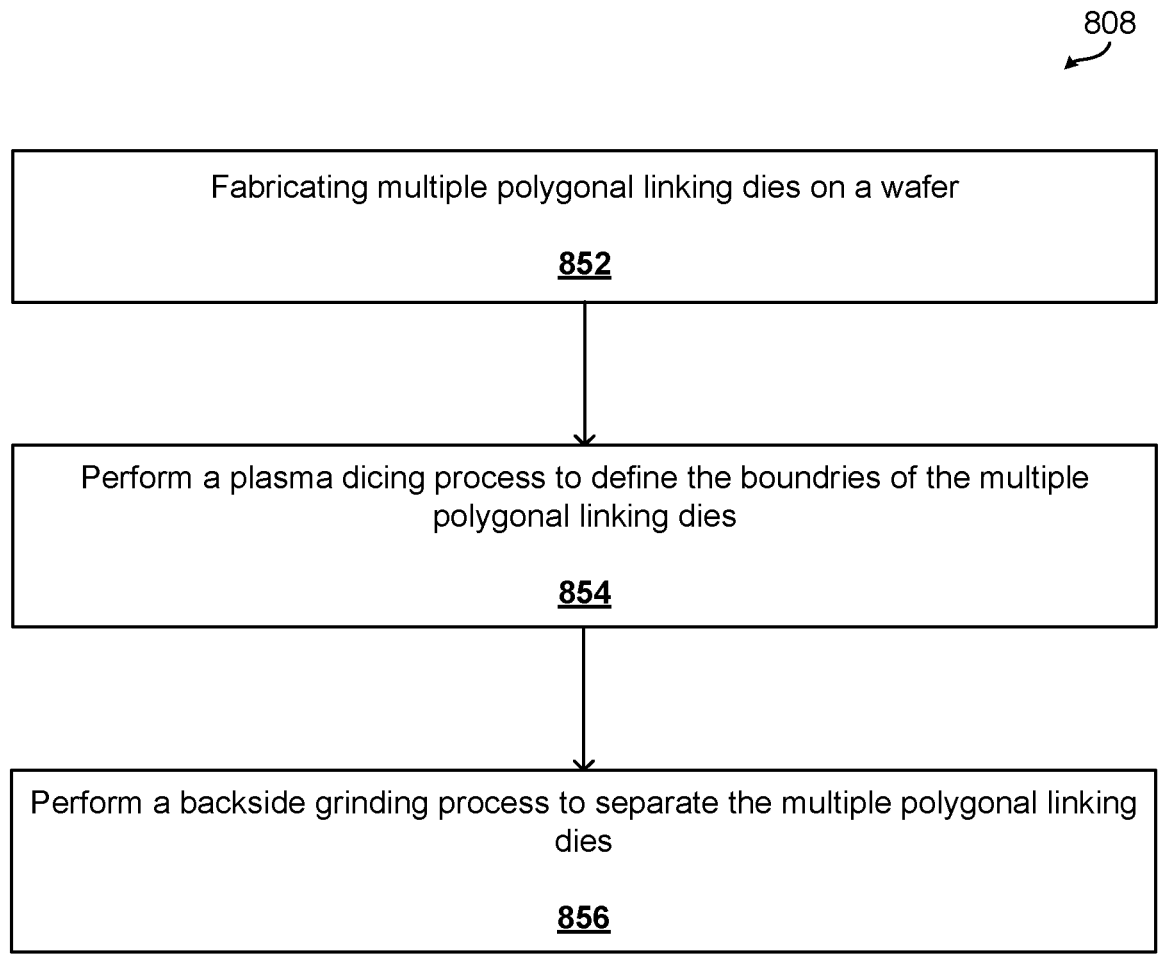
FIG. 8B is a flowchart diagram illustrating an example operation 808 shown in FIG. 8A in accordance with some embodiments.

FIG. 8B is a flowchart diagram illustrating an example operation 808 shown in FIG. 8A in accordance with some embodiments. In the example shown in FIG. 8B, the operation 808 includes operations 852, 854, and 856. Additional operations may be performed.

At operation 852, multiple polygonal linking dies are fabricated on a wafer. In one embodiment, the polygonal linking dies have different geometries and designs. In another embodiment, the polygonal linking dies have the same geometry and design. As mentioned above, each of the polygonal linking die includes a multi-layer interconnect (MLI) structure that allows for routing signals and/or distributing signals as needed. In some embodiments, some of the polygonal linking dies may include semiconductor devices (e.g., passive devices, active devices, etc.) in addition to the MLI structures.

At operation 854, a plasma dicing process is performed to define the boundaries (or edges) of the multiple polygonal linking dies in the horizontal plane (i.e., the X-Y plane). Unlike conventional dicing processes such as mechanical sawing or laser cutting, the plasma dicing process has more flexibility for die layout and design. During the plasma dicing process, deep dicing lanes are etched into the wafer. These deep dicing lanes define the boundaries (edges) of each of the multiple linking dies. In one implementation, the plasma dicing process includes a deep reactive ion etching (DRIE) process. Plasma dicing has the advantages of higher utilization of the wafer area, higher throughput, stronger dies, high yields, in addition to more flexibility for die layout and design.

At operation 856, a backside grinding is performed. After the backside grinding, the remaining substrate (e.g., silicon substrate) at these deep dicing lanes formed at operation 804 is removed. As such, the multiple polygonal linking dies are separated. Each of the multiple polygonal linking dies can be used as shown in FIGS. 1A-1C and 3-7.

Example Geometries of the Polygonal Linking Die

FIGS. 9A-9D are diagrams illustrating example geometries of the polygonal linking die in accordance with some embodiments. In the example shown in FIG. 9A, the polygonal linking die 106 has a "cross" shape, which can be considered as the combination of an elongated portion extending in the Y-direction and another elongated portion extending in the X-direction.

Figure 9A:
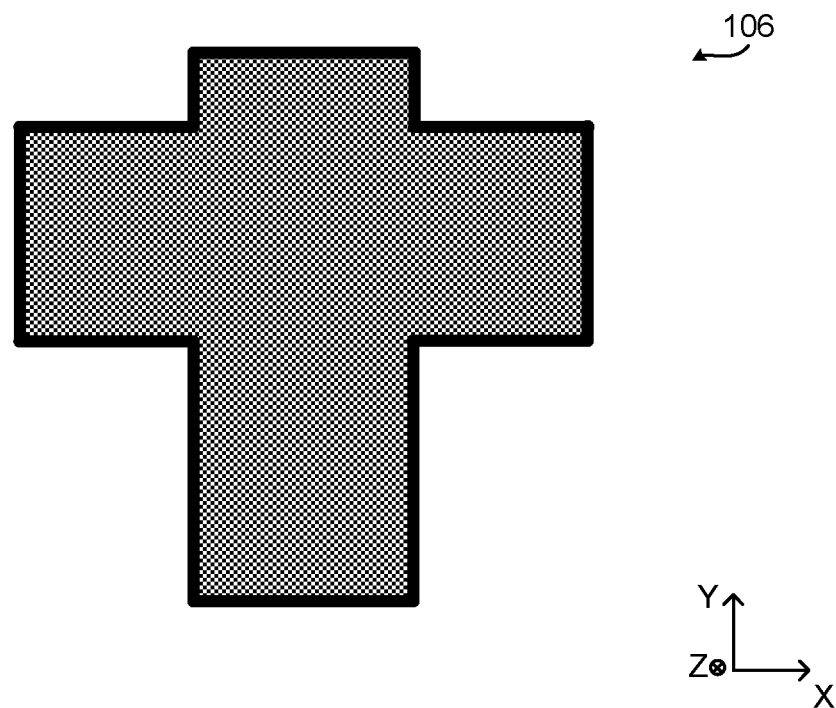
FIGS. 9A-9D are diagrams illustrating example geometries of the polygonal linking die in accordance with some embodiments.
Figure 9B:
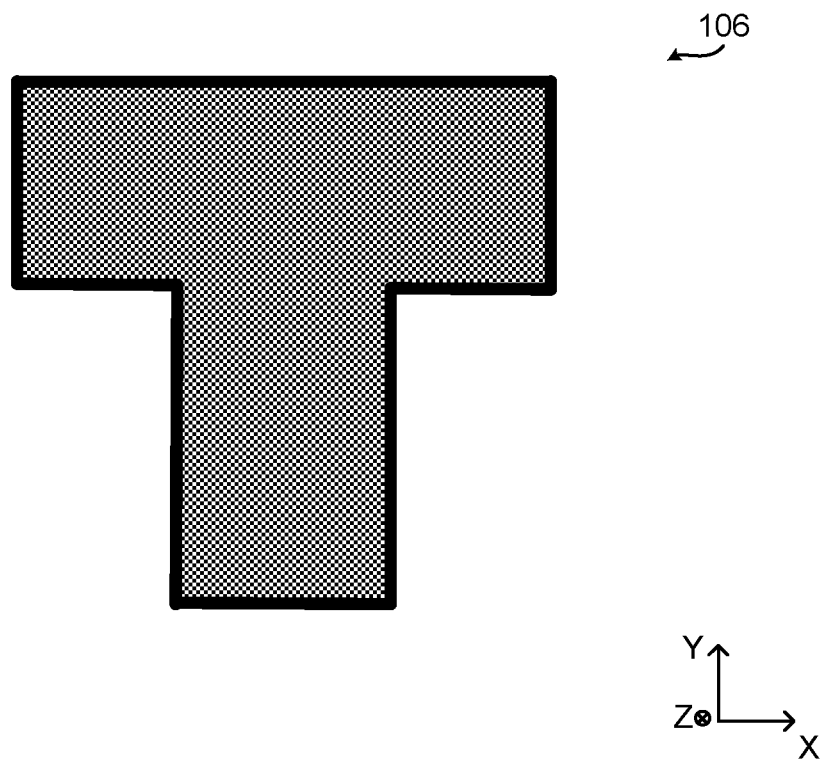

In the example shown in FIG. 9B, the polygonal linking die 106 has a "T" shape, which can be considered as the combination of a first elongated portion extending in the X-direction and a second elongated portion extending in the Y-direction with one end starting from the first elongated portion.

Figure 9C:
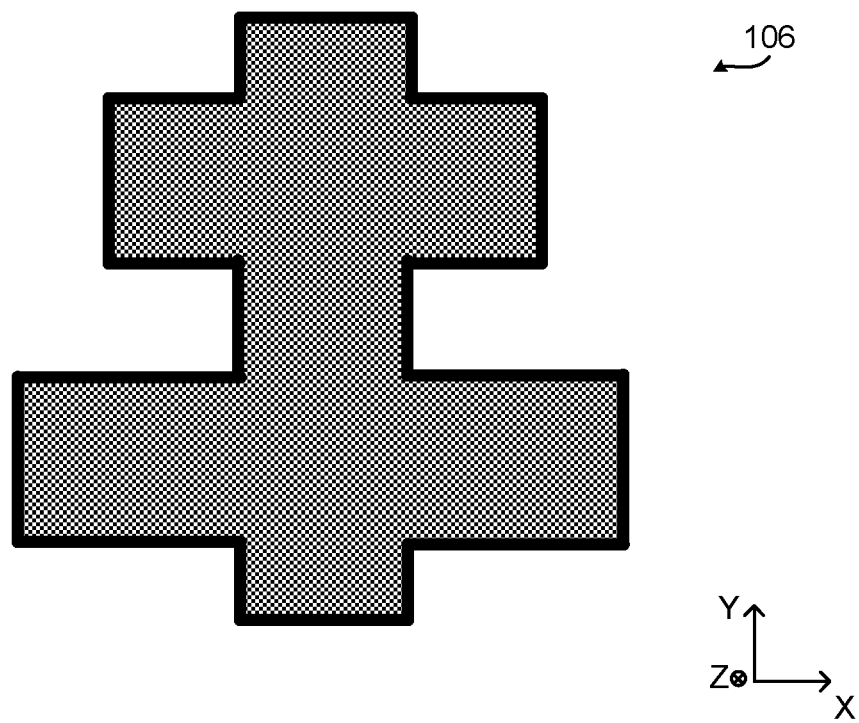

In the example shown in FIG. 9C, the polygonal linking die 106 has a shape, which can be considered as the combination of a first elongated portion extending in the Y-direction, a second elongated portion extending in the X-direction, and a third elongated portion extending in the X-direction. The third elongated portion is longer than the second elongated portion in the X-direction.

Figure 9D:
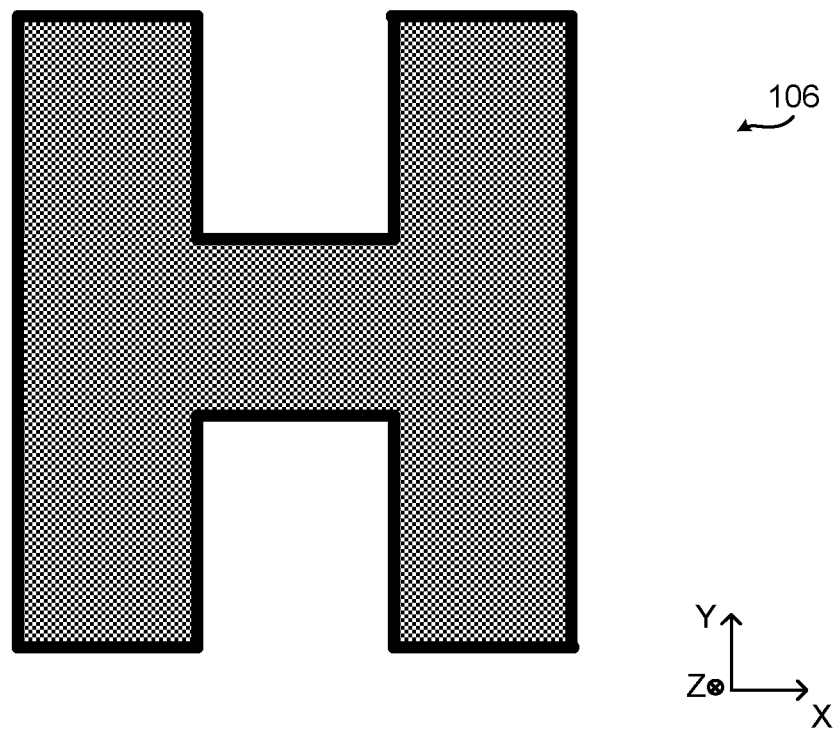

In the example shown in FIG. 9D, the polygonal linking die 106 has an "H" shape, which can be considered as the combination of a first elongated portion extending in the X-direction, a second elongated portion extending in the Y-direction, and a third elongated portion extending in the Y-direction. The third elongated portion and the second elongated portion have the same length in the Y-direction.

While four exemplary geometries of the polygonal linking die 106 are illustrated, it should be understood that other geometries or shapes can be employed in other examples. While the exemplary geometries of the polygonal linking die 106 is characterized by portions extending in either the X-direction or the Y-direction, it should be understood that this is no intended to be limiting. In some embodiments, the polygonal linking die 106 may include an elongated portion that is extended in neither the X-direction nor the Y-direction.

In one implementation, the geometry or shape of a polygonal linking die can be determined based on the distribution of dies at a certain level (e.g., the top vertical level 194 shown in FIGS. 1B and 1C) and the design rules such as minimum distance(s) between two neighboring dies in both the X-direction and the Y-direction.

Example Substrate-to-Substrate Connection Using Polygonal Linking Chip

Figure 10A:
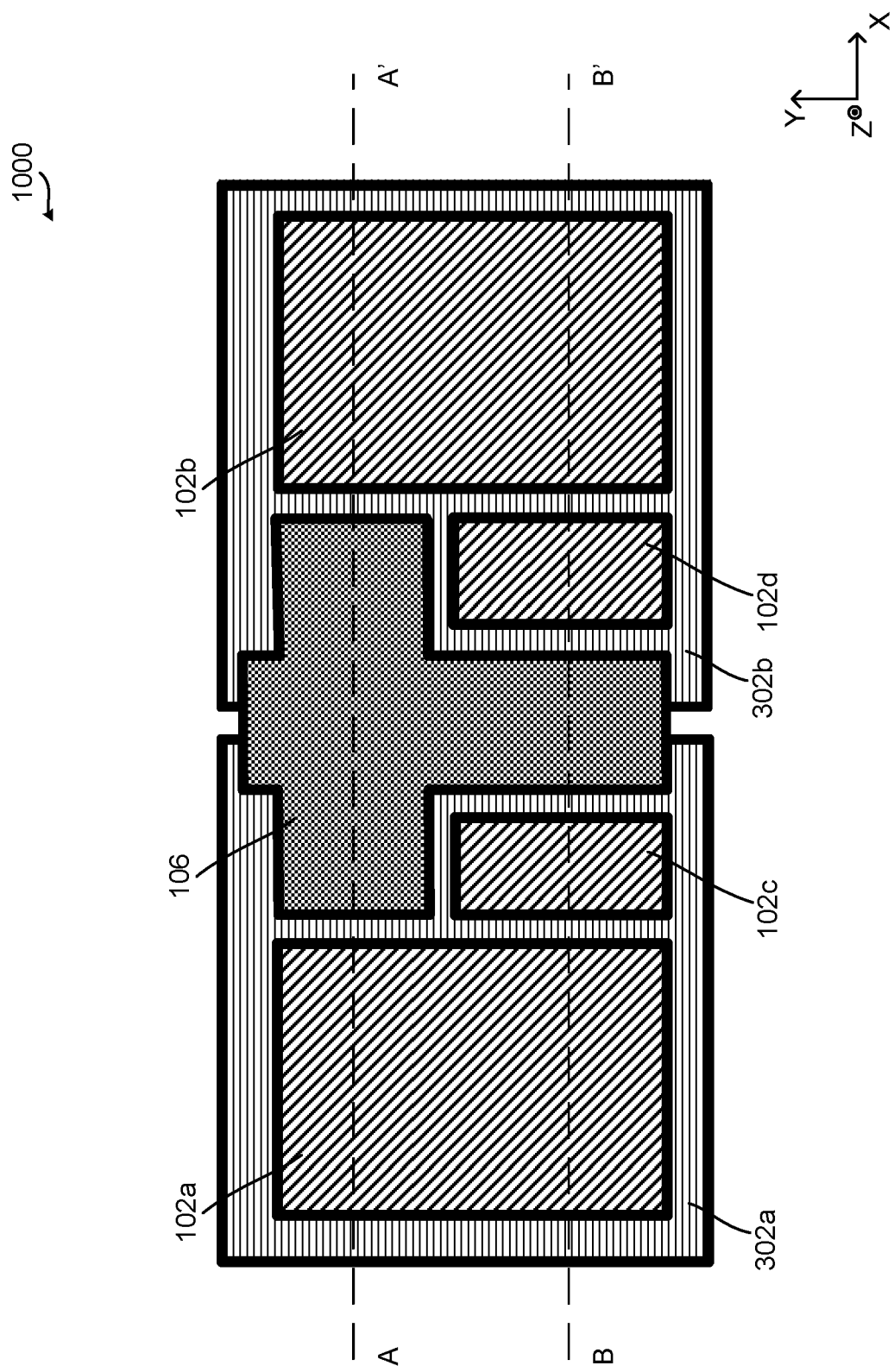
FIG. 10A is a schematic diagram illustrating a top view of an example semiconductor package 1000 in accordance with some embodiments.
Figure 10B:
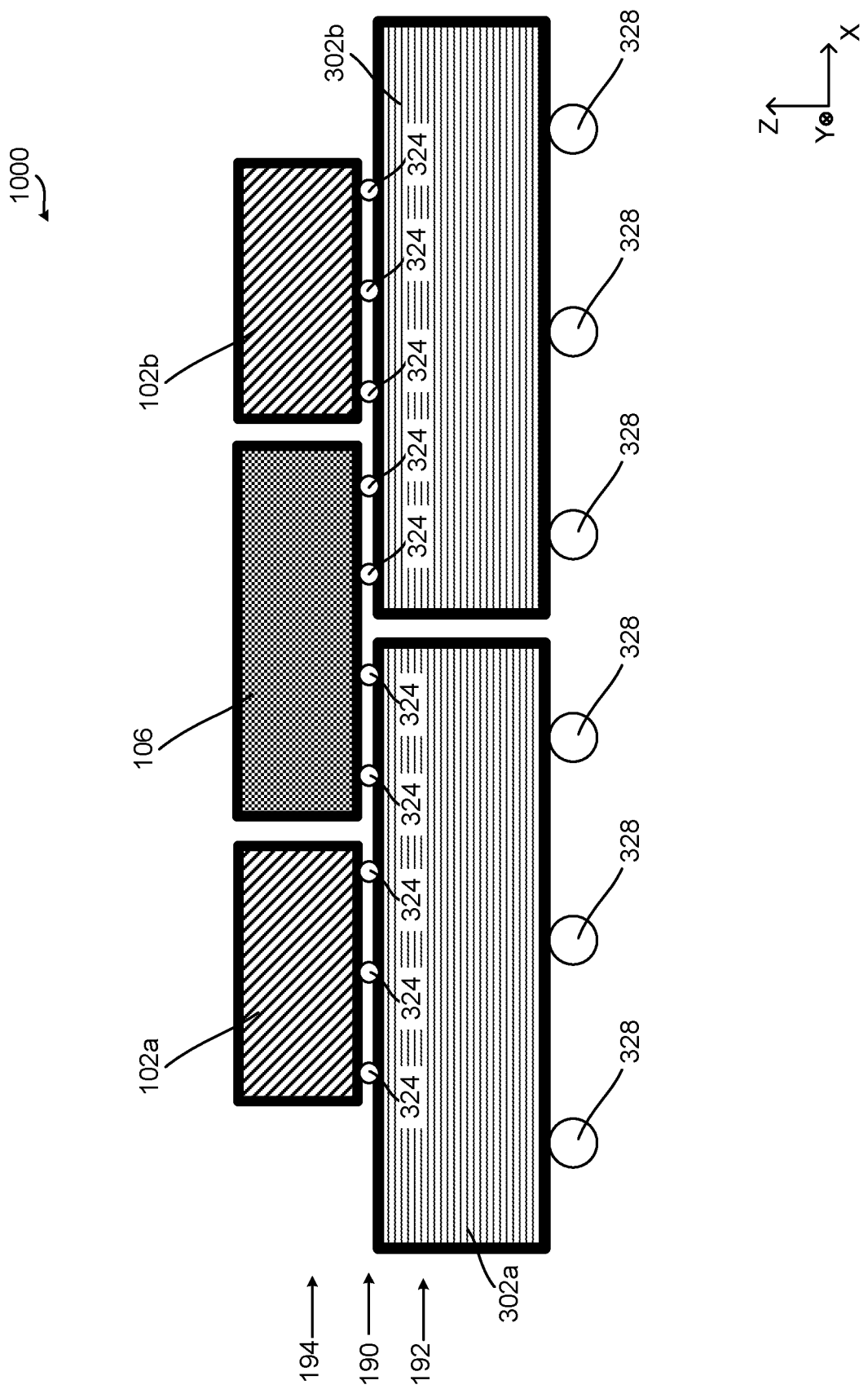
FIG. 10B is a schematic diagram illustrating a cross-sectional view of the example semiconductor package shown in FIG. 10A taken at line A-A' in accordance with some embodiments.

FIG. 10A is a schematic diagram illustrating a top view of an example semiconductor package 1000 in accordance with some embodiments. FIG. 10B is a schematic diagram illustrating a cross-sectional view of the example semiconductor package 1000 taken at line A-A' in accordance with some embodiments. It should be understood that FIGS. 10A-10B are not drawn to scale.

As shown in FIGS. 10A-10B, the semiconductor package 1000 includes, among other components, two package substrates 302a and 302b, four top dies 102a, 102b, 102c, and 102d, and a polygonal linking die 106. In other words, the difference between the embodiment shown in FIGS. 10A-10B and the embodiment shown in FIGS. 1A-1C is that the polygonal linking die 106 links or "bridges" two package substrates 302a and 302b rather than two bottom dies 104a and 104b shown in FIGS. 1A-1C. As such, the polygonal linking die 106 is used for substrate-to-substrate connection rather than die-to-die connection.

The package substrates 302a and 302b are disposed at the same vertical level (e.g., a bottom vertical level 192 shown in FIGS. 10A and 10B). In other words, the package substrates 302a and 302b are aligned in the vertical direction (i.e., the Z-direction shown in FIG. 10B). The package substrates 302a and 302b are lateral to each other in the first horizontal direction (i.e., the X-direction shown in FIG. 10B).

The top dies 102a, 102b, 102c, and 102d are disposed at the same vertical level (e.g., a top vertical level 194 shown in FIG. 10B). In other words, the top dies 102a, 102b, 102c, and 102d are aligned in the Z-direction shown in FIG. 10B. In the example shown in FIGS. 10A and 10B, the top dies 102a and 102c are disposed on the package substrate 302a, whereas the top dies 102b and 102d are disposed on the package substrate 302b. It should be understood that fewer or more top dies can be disposed on the package substrate 302a or on the package substrate 302b in other embodiments.

As shown in FIG. 10B, the top die 102a is bonded to the package substrate 302a using, for example, micro-bumps (i.e., pumps) 324 at the bonding interface 190; the top die 102b is bonded to the package substrate 302b using, for example, micro-bumps (i.e., pumps) 324 at the bonding interface 190.

The top dies 102a, 102b, 102c, and 102d are lateral to each other in the X-direction shown in FIG. 10A. In other embodiments, the top dies 102a, 102b, 102c, and 102d may be lateral to each other in the Y-direction shown in FIG. 10A. In yet other embodiments, the top dies 102a, 102b, 102c, and 102d may be lateral to each other in both the X-direction and the Y-direction. In other words, the top dies 102a, 102b, 102c, and 102d are distributed in the horizontal plane (i.e., the X-Y plane shown in FIG. 10A), subject to design rules such as the minimum distance(s) between two neighboring dies in both the X-direction and the Y-direction.

As mentioned above, the top dies 102a, 102b, 102c, and 102d are conventionally rectangular and vary in size. Therefore, the top dies 102a, 102b, 102c, and 102d do not always utilize the entire area at the top vertical level 194 shown in FIGS. 10A and 10B. In other words, there are certain unoccupied or nonoverlapping areas at the top vertical level 194 due to the rectangular shapes of the top dies 102a, 102b, 102c, and 102d.

In order to utilize these unoccupied or nonoverlapping areas, the polygonal linking die 106 is introduced into the semiconductor package 1000. The polygonal linking die 106 is disposed at the top vertical level 194 and on both the package substrate 302a and the package substrate 302b. As shown in FIG. 10B, the polygonal linking die 106 is bonded to the package substrate 302a using, for example, micro-bumps (i.e., pumps) 324 at the bonding interface 190; the polygonal linking die 106 is bonded to the package substrate 302b using, for example, micro-bumps (i.e., pumps) 324 at the bonding interface 190.

The polygonal linking die 106 is electrically connected to the package substrate 302a through, for example, the micro-bumps 324. The polygonal linking die 106 is electrically connected to the package substrate 302b through, for example, the micro-bumps 324. Since the polygonal linking die 106 includes a MLI structure that allows for routing signals and/or distributing signals as needed, the package substrate 302a and the package substrate 302b are electrically connected through the polygonal linking die 106. In other words, the polygonal linking die 106 operates to "bridge" the package substrate 302a and the package substrate 302b. As a result, the top dies 102a and 102c are electrically connected to the top dies 102b and 102d through the polygonal linking die 106 and the package substrates 302a and 302b. As such, all components in the semiconductor package 1000 are electrically connected or linked.

The polygonal linking die 106 operates to increase vertical electrical connection points within the semiconductor package 1000 because these conventionally unoccupied or nonoverlapping areas at the top vertical level 194 can be utilized to form vertical electrical connection points using, for example, micro-bumps 324.

The package substrates 302a and 302b includes interconnect structures that provide electrical connections between the micro-bumps 324 on its top surface and the package balls 328 on its bottom surface. In some examples, the package substrates 302a and 302b can be bonded to a PCB using package balls 328. In other examples, each of the package substrates 302a and 302b can be bonded to a power node of a power source such as a power supply and a ground node of the power source.

Figure 11:
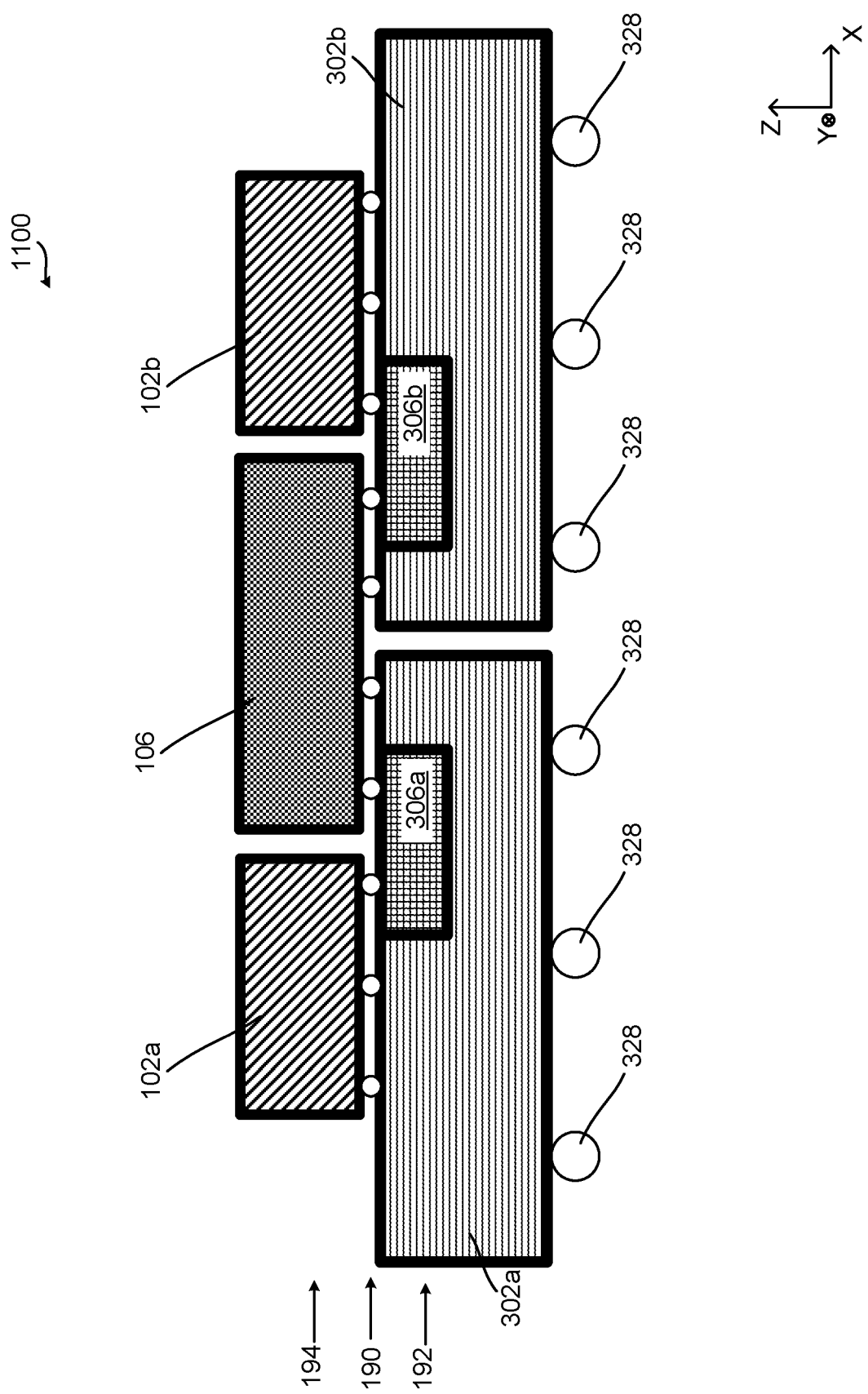
FIG. 11 is a diagram illustrating an example semiconductor package in accordance with some embodiments.

FIG. 11 is a diagram illustrating an example semiconductor package 1100 in accordance with some embodiments. The semiconductor package 1100 shown in FIG. 11 is identical to the semiconductor package 1000 shown in FIGS. 10A and 10B except that a local silicon interconnect (LSI) chip 306a is embedded in the package substrate 302a and a local silicon interconnect (LSI) chip 306b is embedded in the package substrate 302b. Each of the LSI chips 306a and 306b includes interconnect structures (e.g., MLI structures, TSVs, etc.) to provide electrical connections. Therefore, the presence of the LSI chips 306a and 306b provides the semiconductor package 1100 with more electrical connection points and routing resources.

Figure 12:
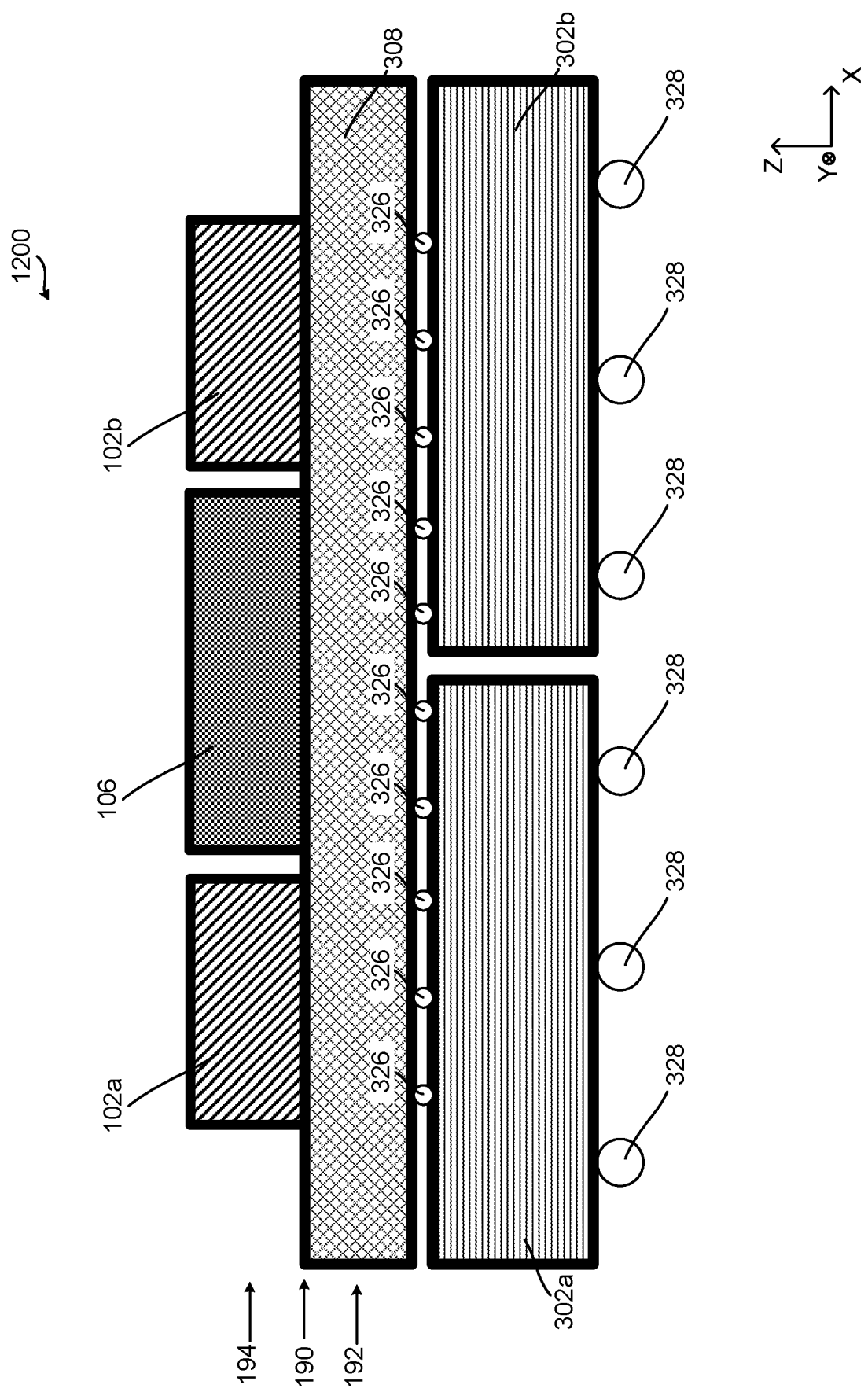
FIG. 12 is a diagram illustrating an example semiconductor package in accordance with some embodiments.

FIG. 12 is a diagram illustrating an example semiconductor package 1200 in accordance with some embodiments. In the example shown in FIG. 12, a semiconductor package 1200 includes, among other components, at least two top dies 102a and 102b, a polygonal linking die 106, a fan-out package structure 308 (e.g., an InFO package structure), and two package substrates 302a and 302b. The top dies 102a and 102b and the polygonal linking die 106 are bonded to the fan-out package structure 308.

In one embodiment, the fan-out package structure 308 includes interconnect structures, such as redistribution layers (RDLs) and through InFO vias (TIVs). In other words, the semiconductor package 1200 is using the InFO packaging platform. The interconnect structures in the fan-out package structure 308 and the polygonal linking die 106 provide electrical connections between the package substrates 302a and 302b. The interconnect structures in the fan-out package structure 308 provide electrical connections between the package substrates 302a and 302b and the top dies 102a and 102b. In some examples, the fan-out package structure 308 includes at least one die and molding compound surrounding the at least one die. The at least one die includes semiconductor devices (e.g., passive devices, active devices, etc.). In other examples, the fan-out package structure 308 may include integrated passive devices (IPDs) such as resistors, capacitors, inductors, microstrips, and impedance matching elements, and the like.

In one implementation, the top die 102a, the top die 102b, and the polygonal linking die 106 are bonded to the fan-out package structure 308 using, for example, micro-bumps, C4 copper bumps, or solder balls, which are connected to RDLs at the top surface of the fan-out package structure 308.

Similarly, the fan-out package structure 308 is bonded to the package substrates 302a and 302b using, for example, C4 copper bumps 326 (or micro-bumps in other examples), which are connected to the RDLs. Each of the package substrates 302a and 302b includes interconnect structures that provide electrical connections between the C4 copper bumps 326 on its top surface and the package balls 328 on its bottom surface.

In accordance with some aspects of the disclosure, a semiconductor die assembly is provided. The semiconductor die assembly includes: a first bottom die and a second bottom die disposed at a bottom vertical level; a first top die disposed at a top vertical level above the bottom vertical level in a vertical direction and bonded to the first bottom die; a second top die disposed at the top vertical level and bonded to the second bottom die; and a linking die disposed at the top vertical level and bonded to both the first bottom die and the second bottom die. The linking die is characterized by a polygonal shape in a horizontal plane perpendicular to the vertical direction, and the polygonal shape is not a rectangle.

In accordance with some aspects of the disclosure, a method for fabricating a semiconductor die assembly is provided. The method includes the following steps: placing a first bottom die and a second bottom die at a bottom vertical level; bonding a first top die to the first bottom die using hybrid bonding, the first top die being at a top vertical level above the bottom vertical level in a vertical direction; bonding a second top die to the second bottom die, the second top die being at the top vertical level; forming a linking die, the linking die being characterized by a polygonal shape in a horizontal plane perpendicular to the vertical direction, and the polygonal shape is not a rectangle; and bonding the linking die to both the first bottom die and the second bottom die, the linking die being at the top vertical level.

In accordance with some aspects of the disclosure, a semiconductor package is provided. The semiconductor package includes a package substrate and a semiconductor die assembly disposed over and electrically connected to the package substrate. The semiconductor die assembly includes: a first bottom die and a second bottom die disposed at a bottom vertical level; a first top die disposed at a top vertical level above the bottom vertical level in a vertical direction and bonded to the first bottom die; a second top die disposed at the top vertical level and bonded to the second bottom die; and a linking die disposed at the top vertical level and bonded to both the first bottom die and the second bottom die. The linking die is characterized by a polygonal shape in a horizontal plane perpendicular to the vertical direction, and the polygonal shape is not a rectangle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die assembly comprising:
   a first bottom die and a second bottom die disposed at a bottom vertical level;
   a first top die disposed at a top vertical level above the bottom vertical level in a vertical direction and bonded to the first bottom die;
   a second top die disposed at the top vertical level and bonded to the second bottom die; and
   a linking die disposed at the top vertical level and bonded to both the first bottom die and the second bottom die, wherein the linking die is characterized by a polygonal shape in a horizontal plane perpendicular to the vertical direction, and the polygonal shape is not a rectangle, and the polygonal shape is determined such that a nonoverlapping area at the top vertical level is minimized.

2. The semiconductor die assembly of claim 1, wherein the first top die is bonded to the first bottom die using hybrid bonding, the second top die is bonded to the second bottom die using hybrid bonding, the linking die is bonded to both the first bottom die and the second bottom die using hybrid bonding.

3. The semiconductor die assembly of claim 1, wherein the linking die comprises a multilayer interconnect structure.

4. The semiconductor die assembly of claim 3, wherein the linking die further comprises semiconductor devices.

5. The semiconductor die assembly of claim 1, wherein the polygonal shape is a "T" shape.

6. The semiconductor die assembly of claim 1, wherein the polygonal shape is a "cross" shape.

7. The semiconductor die assembly of claim 1, wherein the polygonal shape is an "H" shape.

8. The semiconductor die assembly of claim 1, wherein the linking die is separated using plasma dicing.

9. The semiconductor die assembly of claim 1, further comprising:
- a third top die disposed at the top vertical level and bonded to the first bottom die; and
- a fourth top die disposed at the top vertical level and bonded to the second bottom die.

10. The semiconductor die assembly of claim 1, wherein a first bonding layer at a bottom surface of the linking die is bonded to a second bonding layer at a top surface of the first bottom die, a first hybrid bonding metal pad disposed in the first bonding layer is bonded to a second hybrid bonding metal pad disposed in the second bonding layer.

11. A method for fabricating a semiconductor die assembly comprising:
- placing a first bottom die and a second bottom die at a bottom vertical level;
- bonding a first top die to the first bottom die using hybrid bonding, the first top die being at a top vertical level above the bottom vertical level in a vertical direction;
- bonding a second top die to the second bottom die, the second top die being at the top vertical level;
- forming a linking die, the linking die being characterized by a polygonal shape in a horizontal plane perpendicular to the vertical direction, and the polygonal shape is not a rectangle, and the polygonal shape is determined such that a nonoverlapping area at the top vertical level is minimized; and
- bonding the linking die to both the first bottom die and the second bottom die, the linking die being at the top vertical level.

12. The method of claim 11, wherein the forming the linking die comprises:
- fabricating the linking die on a wafer;
- performing a plasma dicing process to define boundaries of the linking die; and
- performing a backside grinding process to separate the linking die.

13. The method of claim 11, further comprising:
- determining the polygonal shape based at least on geometries of the first top die and the second top die.

14. A semiconductor package comprising:
- a package substrate;
- a semiconductor die assembly disposed over and electrically connected to the package substrate, wherein the semiconductor die assembly comprises:
  - a first bottom die and a second bottom die disposed at a bottom vertical level;
  - a first top die disposed at a top vertical level above the bottom vertical level in a vertical direction and bonded to the first bottom die;
  - a second top die disposed at the top vertical level and bonded to the second bottom die; and
  - a linking die disposed at the top vertical level and bonded to both the first bottom die and the second bottom die, wherein the linking die is characterized by a polygonal shape in a horizontal plane perpendicular to the vertical direction, and the polygonal shape is not a rectangle, and the polygonal shape is determined such that a nonoverlapping area at the top vertical level is minimized.

15. The semiconductor package of claim 14, wherein the first top die is bonded to the first bottom die using hybrid bonding, the second top die is bonded to the second bottom die using hybrid bonding, the linking die is bonded to both the first bottom die and the second bottom die using hybrid bonding.

16. The semiconductor package of claim 14, wherein the first bottom die and the second bottom die are bonded to the package substrate.

17. The semiconductor package of claim 16, wherein a local silicon interconnect (LSI) chip is embedded in the package substrate, and the LSI chip is electrically connected to both the first bottom die and the second bottom die.

18. The semiconductor package of claim 14, further comprising:
- a silicon chip disposed between the semiconductor die assembly and the package substrate in the vertical direction, wherein the silicon chip is bonded to the first bottom die and the second bottom die using hybrid bonding, and the silicon chip is bonded to the package substrate.

19. The semiconductor package of claim 14, further comprising:
- a silicon chip disposed between the semiconductor die assembly and the package substrate in the vertical direction, wherein the silicon chip is bonded to the first bottom die and the second bottom die through microbumps, and the silicon chip is bonded to the package substrate.

20. The semiconductor die assembly of claim 10, wherein the first bonding layer at the bottom surface of the linking die is bonded to a third bonding layer at a top surface of the second bottom die, a third hybrid bonding metal pad disposed in the first bonding layer is bonded to a fourth hybrid bonding metal pad disposed in the third bonding layer.

* * * * *